(12) United States Patent
Adachi et al.

(10) Patent No.: US 10,134,904 B2
(45) Date of Patent: Nov. 20, 2018

(54) SEMICONDUCTOR DEVICE HAVING A FLEXIBLE SUBSTRATE AND A CRACK-PREVENTING SEMICONDUCTOR LAYER

(71) Applicant: Semiconductor Energy Laboratory Co., Ltd., Atsugi-shi, Kanagawa-ken (JP)

(72) Inventors: Hiroki Adachi, Tochigi (JP); Kayo Kumakura, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/976,411

(22) Filed: Dec. 21, 2015

(65) Prior Publication Data

US 2016/0111550 A1    Apr. 21, 2016

Related U.S. Application Data

(62) Division of application No. 14/246,407, filed on Apr. 7, 2014, now Pat. No. 9,257,560.

(30) Foreign Application Priority Data

Apr. 10, 2013   (JP) .................................. 2013-081897

(51) Int. Cl.
*H01L 21/77* (2017.01)
*H01L 21/84* (2006.01)
(Continued)

(52) U.S. Cl.
CPC ........ *H01L 29/78603* (2013.01); *H01L 21/84* (2013.01); *H01L 27/1218* (2013.01);
(Continued)

(58) Field of Classification Search
CPC . H01L 21/78–21/86; H01L 27/1214–27/1296;
(Continued)

(56) References Cited

U.S. PATENT DOCUMENTS 5,764,320 A    6/1998  Konuma et al.
5,982,471 A   11/1999  Hirakata et al.
(Continued)

FOREIGN PATENT DOCUMENTS

CN    001959984 A    5/2007
EP       0858110 B   12/2006
(Continued)

OTHER PUBLICATIONS

German Office Action (Application No. 102014019787.5) dated Mar. 10, 2017.
(Continued)

*Primary Examiner* — Kevin Parendo
(74) *Attorney, Agent, or Firm* — Robinson Intellectual Property Law Office; Eric J. Robinson

(57) ABSTRACT

Provided is a flexible device with fewer defects caused by a crack or a flexible device having high productivity. A semiconductor device including: a display portion over a flexible substrate, including a transistor and a display element; a semiconductor layer surrounding the display portion; and an insulating layer over the transistor and the semiconductor layer. When seen in a direction perpendicular to a surface of the flexible substrate, an end portion of the substrate is substantially aligned with an end portion of the semiconductor layer, and an end portion of the insulating layer is positioned over the semiconductor layer.

12 Claims, 12 Drawing Sheets

(51) Int. Cl.
*H01L 27/12* (2006.01)
*H01L 29/786* (2006.01)

(52) U.S. Cl.
CPC ...... *H01L 27/1222* (2013.01); *H01L 27/1262* (2013.01); *H01L 29/78606* (2013.01); *H01L 2021/775* (2013.01)

(58) Field of Classification Search
CPC .. H01L 29/786–29/78696; H01L 21/84; H01L 27/1218; H01L 27/1244; H01L 27/1262; H01L 29/78603; H01L 29/78606; H01L 23/4985; H01L 31/03926; H01L 23/5387
See application file for complete search history.

(56) References Cited

U.S. PATENT DOCUMENTS

| | | | |
|---|---|---|---|
| 5,995,189 A | 11/1999 | Zhang | |
| 6,013,542 A | 1/2000 | Yamazaki et al. | |
| 6,127,199 A | 10/2000 | Inoue et al. | |
| 6,239,850 B1 | 5/2001 | Ohori et al. | |
| 6,246,454 B1 | 6/2001 | Koyama et al. | |
| 6,372,608 B1 | 4/2002 | Shimoda et al. | |
| 6,411,351 B1 | 6/2002 | Zhang et al. | |
| 6,645,830 B2 | 11/2003 | Shimoda et al. | |
| 6,818,530 B2 | 11/2004 | Shimoda et al. | |
| 7,094,665 B2 | 8/2006 | Shimoda et al. | |
| 7,285,476 B2 | 10/2007 | Shimoda et al. | |
| 7,426,008 B2 | 9/2008 | Yamazaki et al. | |
| 7,468,308 B2 | 12/2008 | Shimoda | |
| 7,619,251 B2 | 11/2009 | Sato et al. | |
| 7,632,721 B2 | 12/2009 | Yamazaki et al. | |
| 7,688,290 B2 | 3/2010 | Yamazaki et al. | |
| 7,768,136 B2 | 8/2010 | Fukuta et al. | |
| 7,843,041 B2 | 11/2010 | Kodaira et al. | |
| 7,968,386 B2 | 6/2011 | Yamazaki et al. | |
| 8,367,440 B2 | 2/2013 | Takayama et al. | |
| 8,415,208 B2 | 4/2013 | Takayama et al. | |
| 8,634,050 B2 | 1/2014 | Yamazaki et al. | |
| 8,685,835 B2 | 4/2014 | Yamazaki et al. | |
| 2001/0053560 A1 | 12/2001 | Shinohara et al. | |
| 2003/0032210 A1 | 2/2003 | Takayama et al. | |
| 2004/0042285 A1 | 3/2004 | Yoshizawa et al. | |
| 2006/0055002 A1 | 3/2006 | Yao et al. | |
| 2007/0211189 A1 | 9/2007 | Yamazaki et al. | |
| 2007/0241664 A1 | 10/2007 | Sakamoto et al. | |
| 2008/0049182 A1 | 2/2008 | Kawabe et al. | |
| 2008/0179710 A1 | 7/2008 | Yip et al. | |
| 2009/0039349 A1 | 2/2009 | Honda | |
| 2009/0090940 A1 | 4/2009 | Tsurume et al. | |
| 2009/0239320 A1 | 9/2009 | Takayama et al. | |
| 2009/0289255 A1 | 11/2009 | Lee et al. | |
| 2011/0318889 A1 | 12/2011 | Chida | |
| 2012/0025207 A1 | 2/2012 | Kosaka | |
| 2013/0193484 A1* | 8/2013 | Katsaros | H01L 21/84 257/192 |
| 2013/0214324 A1 | 8/2013 | Takayama et al. | |
| 2014/0061864 A1* | 3/2014 | Hyun | H01L 23/562 257/620 |
| 2014/0132908 A1 | 5/2014 | Yamazaki et al. | |
| 2014/0203410 A1* | 7/2014 | Zhang | H01L 21/78 257/620 |
| 2014/0231812 A1 | 8/2014 | Nishida et al. | |

FOREIGN PATENT DOCUMENTS

| | | |
|---|---|---|
| EP | 1351308 B | 4/2009 |
| EP | 1744365 B | 4/2009 |
| JP | 08-006069 A | 1/1996 |
| JP | 10-125931 A | 5/1998 |
| JP | 2003-174153 A | 6/2003 |
| JP | 2003-195789 A | 7/2003 |
| JP | 2006-332303 A | 12/2006 |
| JP | 2007-227875 A | 9/2007 |
| JP | 2007-248576 A | 9/2007 |
| JP | 2010-224426 A | 10/2010 |
| TW | 200539250 | 12/2005 |
| TW | 200636883 | 10/2006 |
| TW | 200903088 | 1/2009 |
| WO | WO-2005/076358 | 8/2005 |

OTHER PUBLICATIONS

Taiwanese Office Action (Application No. 103111261) dated Apr. 28, 2017.
Chinese Office Action (Application No. 201410140919.0) dated Feb. 9, 2018.
Taiwanese Office Action (Application No. 106136236) dated Sep. 18, 2018.

* cited by examiner

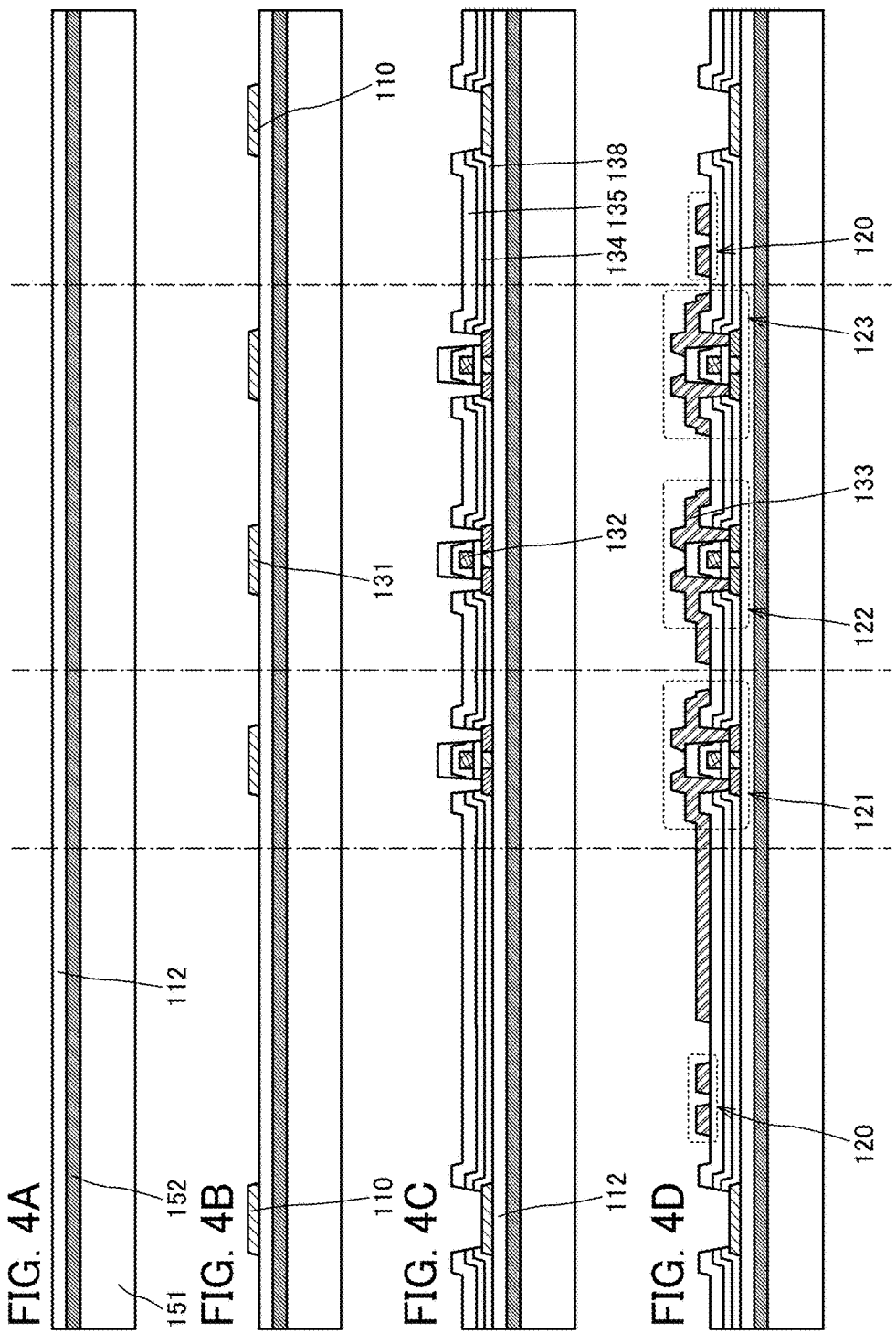

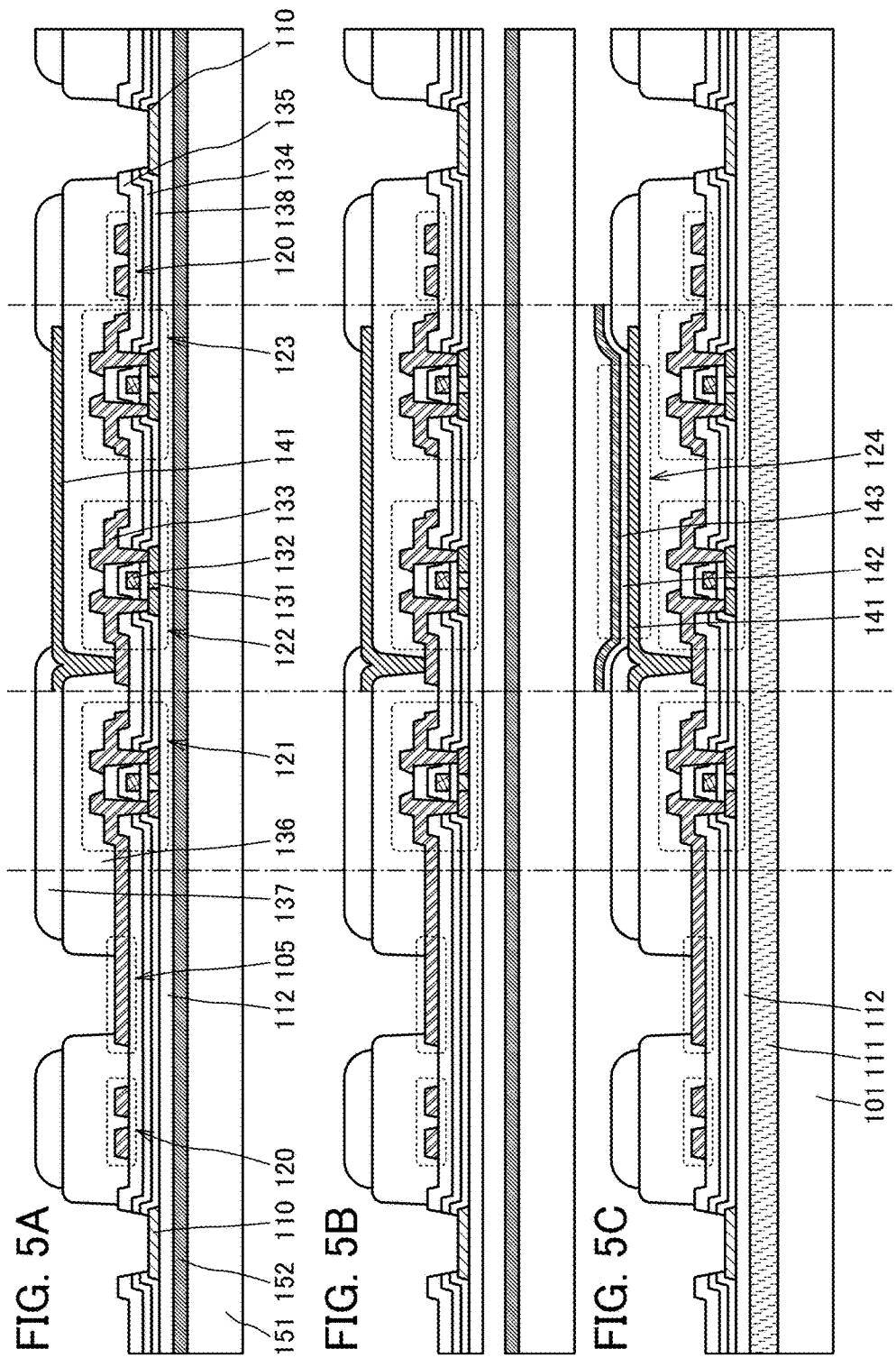

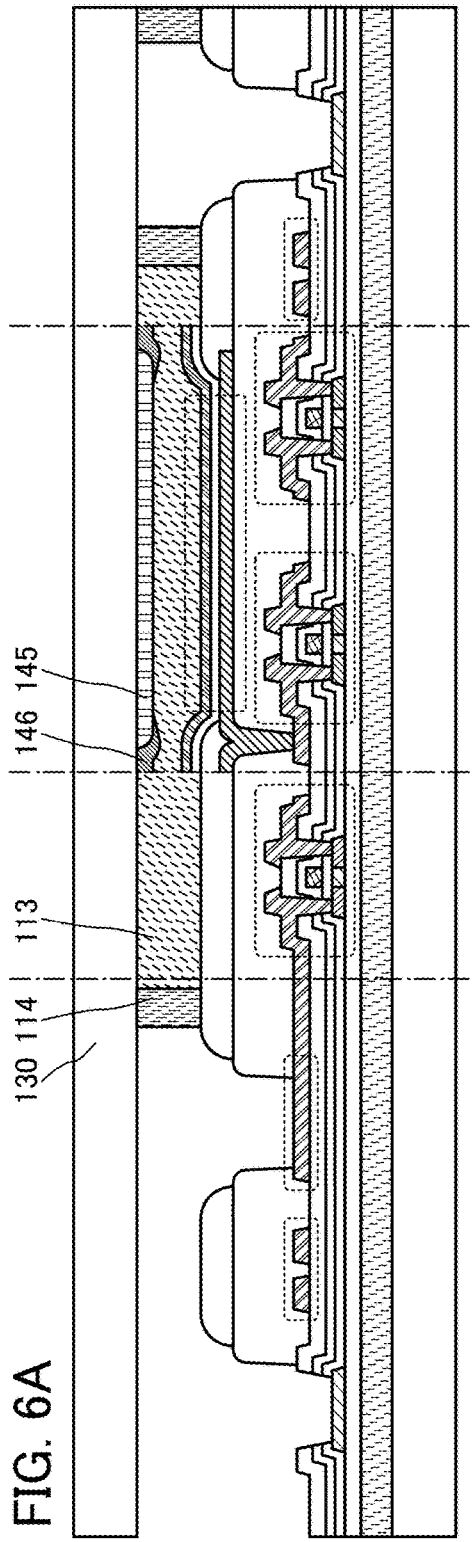
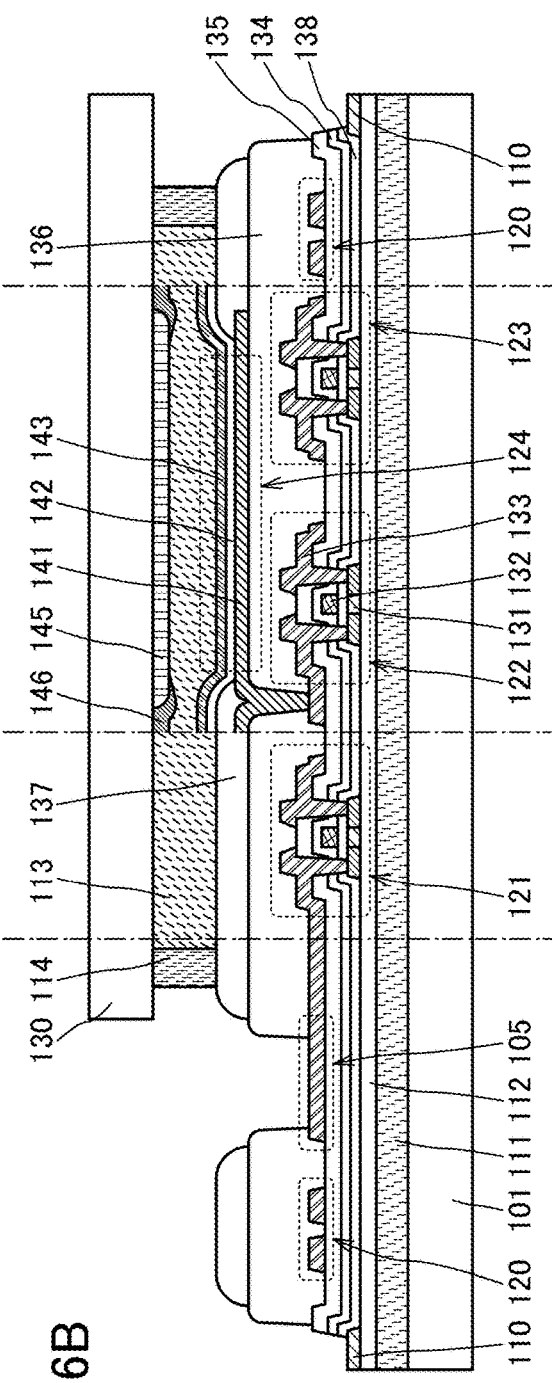

500 μm substrate, bonding layer, semiconductor layer, first insulating layer, conductive layer, second insulating layer, layer to be peeled 500 μm substrate
bonding layer
layer to be peeled
semiconductor layer
first insulating layer
second insulating layer
conductive layer substrate                                            conductive layer bonding layer     first insulating layer layer to be peeled      second insulating layer

SEMICONDUCTOR DEVICE HAVING A FLEXIBLE SUBSTRATE AND A CRACK-PREVENTING SEMICONDUCTOR LAYER

BACKGROUND OF THE INVENTION

1. Field of the Invention

The present invention relates to a semiconductor device.

The "semiconductor device" in this specification and the like means all devices that can operate by utilizing semiconductor characteristics. Accordingly, a transistor, a semiconductor element, a semiconductor circuit, a memory device, an imaging device, an electro-optical device, a power generation device (e.g., a thin film solar cell and an organic thin film solar cell), an electronic device, and the like are included in the category of the semiconductor device.

2. Description of the Related Art

In recent years, a flexible device in which a semiconductor element, a light-emitting element, and the like are provided over a flexible substrate has been developed. Typical examples of the flexible device include, as well as a lighting device and an image display device, a variety of semiconductor circuits including a semiconductor element such as a transistor.

As a method of manufacturing a semiconductor device including a flexible substrate, a technique has been developed in which a semiconductor element such as a thin film transistor is formed over a support substrate (e.g., a glass substrate or a quartz substrate), and then the semiconductor element is transferred to a flexible substrate. This technique needs a step of separating a layer including the semiconductor element from the support substrate.

For example, Patent Document 1 discloses a peeling technique using laser ablation as follows. A separation layer formed of amorphous silicon or the like is formed over a substrate, a layer to be peeled is formed over the separation layer, and the peeled layer is bonded to a transfer body with a bonding layer. The separation layer is ablated by laser irradiation, so that peeling occurs in the separation layer.

Patent Document 2 discloses a peeling technique as follows. A metal layer is formed between a substrate and an oxide layer and peeling is performed at the interface between the oxide layer and the metal layer by utilizing weak bonding at the interface, so that a layer to be peeled and the substrate are separated from each other.

REFERENCE

Patent Document

[Patent Document 1] Japanese Published Patent Application No. H10-125931

[Patent Document 2] Japanese Published Patent Application No. 2003-174153

SUMMARY OF THE INVENTION

In the case where peeling is performed between a peeling layer provided over a substrate and a layer to be peeled (hereinafter referred to as layer) formed over the peeling layer, a stack formed of thin films (e.g., the layer, a thin film transistor (TFT), a wiring, and an interlayer film) is provided over the peeling layer. The stack has a thickness of several micrometers or less and is very fragile. When peeling is performed between the peeling layer and the layer, a high bending stress is applied to an end portion of the layer (a peeling starting point); as a result, breaking or cracking (hereinafter, collectively referred to as crack) easily occurs in the layer. Moreover, when such a crack develops from the end portion of the layer into a semiconductor element or a light-emitting element, these elements might be broken.

To improve productivity of flexible devices, it is preferable that a plurality of devices be manufactured at a time over a large substrate and the substrate be divided with a scriber or the like. This step causes a problem in that a crack occurs in or develops from an end portion of the substrate due to stress applied when the substrate is divided.

In view of the above, an object of one embodiment of the present invention is to provide a flexible device with fewer defects caused by a crack. Another object is to provide a flexible device having high productivity.

Note that in one embodiment of the present invention, there is no need to achieve all the objects. The description of these objects does not disturb the existence of other objects. Other objects will be apparent from and can be derived from the description of the specification, the drawings, the claims, and the like.

One embodiment of the present invention is a semiconductor device including: a display portion over a flexible substrate, including a transistor and a display element; a semiconductor layer surrounding the display portion; and an insulating layer over the transistor and the semiconductor layer. When seen in a direction perpendicular to a surface of the flexible substrate, an end portion of the substrate is substantially aligned with an end portion of the semiconductor layer, and an end portion of the insulating layer is positioned over the semiconductor layer.

In the semiconductor device with the above structure, the semiconductor layer preferably contains the same material as a semiconductor in a channel of the transistor.

In the semiconductor device with the above structure, it is preferable that a conductive layer surrounding the display portion be further included between the display portion and the semiconductor layer.

In the semiconductor device with the above structure, the conductive layer preferably contains the same material as a gate electrode, a source electrode, or a drain electrode of the transistor.

Another embodiment of the present invention is a method of manufacturing a semiconductor device, including the steps of: forming a peeling layer over a support substrate; forming a layer over the peeling layer; forming, over the layer, a transistor and a semiconductor layer surrounding the transistor; forming, over the transistor and the semiconductor layer, an insulating layer with an opening over the semiconductor layer; separating the peeling layer and the support substrate from the layer; bonding a flexible substrate to a separated surface of the layer; and cutting the flexible substrate, the layer, and the semiconductor layer in a position overlapping with the opening.

In this specification and the like, the expression that an end portion of a layer is "substantially aligned" with an end portion of another layer includes the case where the end portions of the layers do not completely overlap with each other (needless to say, the expression includes the case where the end portions of the layers completely overlap with each other); for example, an end portion of an upper layer may be positioned on an inner side than an end portion of a lower layer, or may be positioned on an outer side than the end portion of the lower layer.

The present invention can provide a flexible device with fewer defects caused by a crack or a flexible device having high productivity.

BRIEF DESCRIPTION OF THE DRAWINGS

FIGS. 4A to 4D illustrate a method of manufacturing a display device in Embodiment.

FIGS. 5A to 5C illustrate the method of manufacturing the display device in Embodiment.

FIGS. 6A and 6B illustrate the method of manufacturing the display device in Embodiment.

DETAILED DESCRIPTION OF THE INVENTION

Figure 1A:
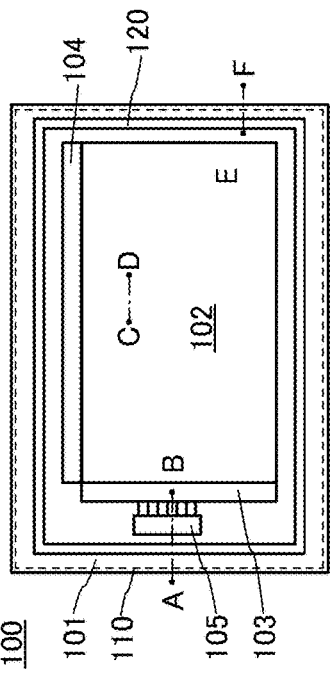
FIGS. 1A and 1B illustrate a structural example of a display device in Embodiment.

Embodiments will be described in detail with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments.

Note that in the structures of the present invention to be described below, the same portions or portions having similar functions are denoted by the same reference numerals in different drawings, and description of such portions will not be repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the scale of each structure is not necessarily limited to that illustrated in the drawings.

Note that in this specification and the like, ordinal numbers such as "first", "second", and the like are used in order to avoid confusion among components and do not limit the number.

Embodiment 1

In this embodiment, a structure and a manufacturing method of an image display device, which is an example of a semiconductor device of one embodiment of the present invention, are described with reference to drawings. As an example of the image display device, an image display device (hereinafter, also referred to as display device) including an organic EL element is described below.

Note that in this specification and the like, the display device may include any of the following modules in its category: a module in which a connector such as a flexible printed circuit (FPC) or a tape carrier package (TCP) is attached to a display device; a module having a TCP provided with a printed wiring board at the end thereof; a module having an integrated circuit (IC) directly mounted over a substrate over which a display element is formed by a chip on glass (COG) method; a module in which a touch sensor is mounted.

[Structural Example of Display Device]

FIG. 1A is a schematic top view of a display device 100 with a top emission structure. Note that in FIG. 1A, some components are not illustrated for clarity.

The display device 100 includes, over a flexible substrate 101, a display portion 102; a signal line driver circuit 103; a scan line driver circuit 104; and an external connection terminal 105 electrically connected to these elements. For example, an FPC or an IC can be mounted on the external connection terminal 105, and via these elements, a signal such as a power supply potential and a driving signal can be input to the display portion 102, the signal line driver circuit 103, and the scan line driver circuit 104.

Here, a semiconductor layer 110 is provided in an end portion of the substrate 101 to surround the display portion 102. The semiconductor layer 110 is provided over and along a periphery of the substrate 101.

A conductive layer 120 is provided between the semiconductor layer 110 and the display portion 102 to surround the display portion 102.

Figure 1B:
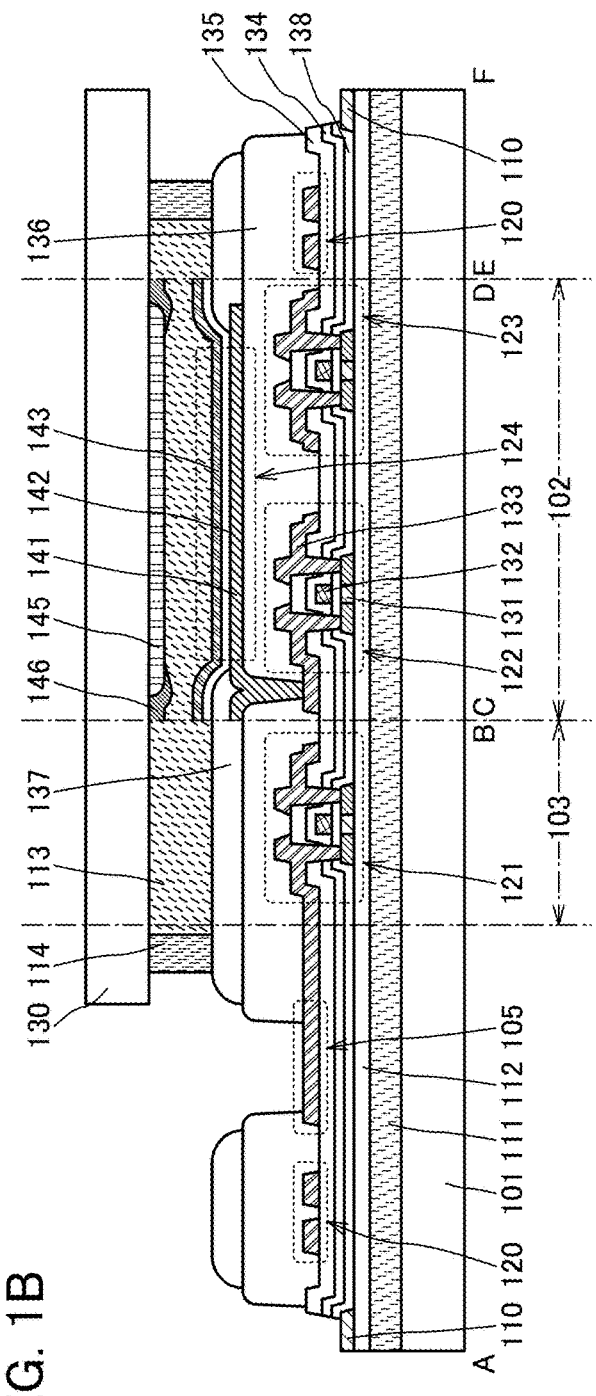

FIG. 1B is a schematic cross-sectional view taken along the lines A-B, C-D, and E-F in FIG. 1A. The line A-B cuts a region including the end portion of the substrate 101, the external connection terminal 105, and the signal line driver circuit 103. The line C-D cuts a region including the display portion 102. The line E-F cuts a region including an opposite end portion of the substrate 101.

In the display device 100, a layer 112 to be peeled (hereinafter referred to as layer 112) is provided over the flexible substrate 101 with a bonding layer 111 positioned therebetween. A light-emitting element 124 functioning as a display element; a transistor which are components of the display portion 102, the signal line driver circuit 103, the scan line driver circuit 104, or the like; the external connection terminal 105; the semiconductor layer 110; the conductive layer 120; and the like are provided over the layer 112.

Figure 2A:
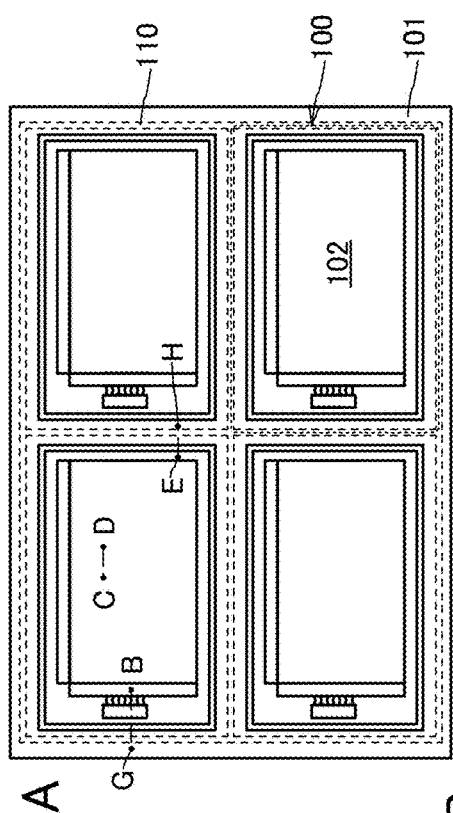
FIGS. 2A and 2B illustrate a structural example of a display device in Embodiment.
Figure 2B:
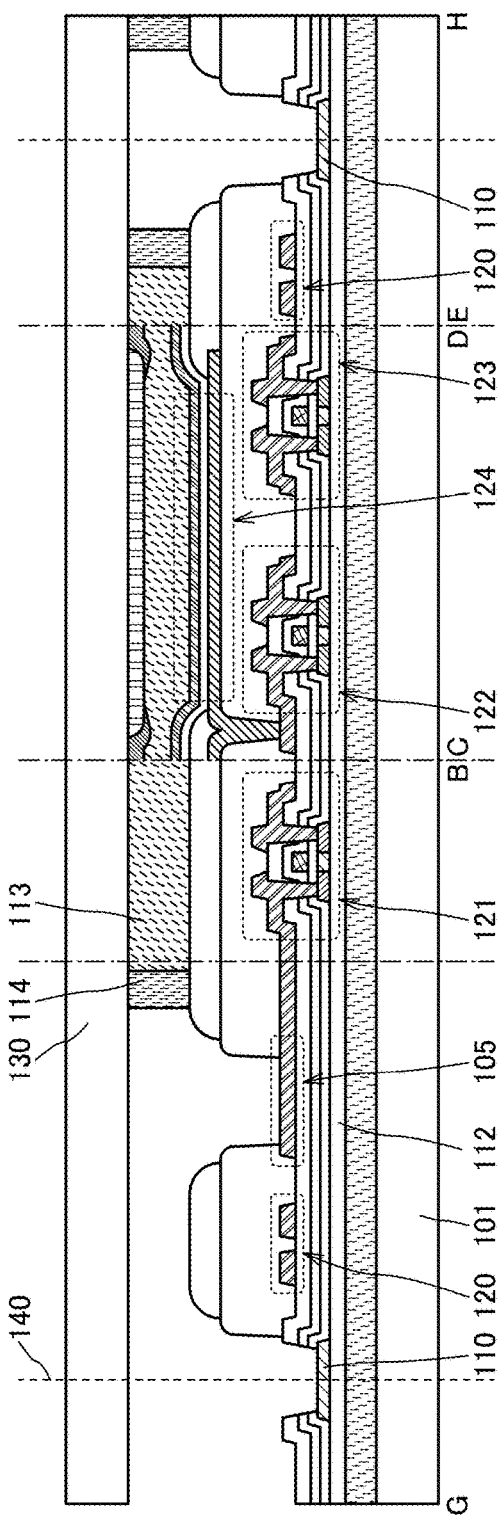

The structure of the display device 100 is suitable for obtaining a plurality of devices from one substrate in such a manner that a plurality of display devices 100 is manufactured at a time over one substrate, and then the substrate is divided for separating the plurality of display devices 100. FIG. 2A is a schematic top view showing a state after four display devices 100 are manufactured at a time over a substrate and before the substrate is divided. FIG. 2B is a schematic cross-sectional view taken along the lines G-B, C-D, and E-H in FIG. 2A.

FIG. 2A shows the case where four display devices 100 are arranged (in a 2×2 matrix). Arrangement of the display devices 100 (e.g., the direction and the number of display devices 100) is not limited to the above. Arrangement by which as many display devices 100 as possible can be arrayed is employed depending on the substrate size, the area of each display device 100, and the like.

The display portion 102 in each display device 100 is surrounded by the semiconductor layer 110. That is, there is at least one semiconductor layer 110 between two adjacent display devices 100. When the substrate provided with the display devices 100 is divided for separating the devices, a cut portion 140 overlaps with the semiconductor layer 110.

Openings are formed in insulating layers (e.g., insulating layers 134, 135, 136, and 137) over at least the transistor such that a top surface of the semiconductor layer 110 is partly exposed. In FIGS. 1A and 1B and FIGS. 2A and 2B, the openings are also formed in an insulating layer 138 that is over the semiconductor layer 110 and functions as a gate insulating layer of the transistor.

Thus, in the state where the substrate 101 is divided (FIGS. 1A and 1B), the openings overlap with the end portions (end faces) of the substrate 101. The division is performed in a region overlapping with the semiconductor layer 110, so that an end portion (end face) of the divided semiconductor layer 110 is substantially aligned with an end portion (end face) of the substrate 101. In other words, when seen in a direction perpendicular to a surface of the substrate 101, an end portion of the substrate 101 is substantially aligned with an end portion of the semiconductor layer 110, and an end portion of the insulating layer is positioned over the semiconductor layer 110.

With this structure in which the semiconductor layer 110 is not covered with an insulating layer in the cut portion 140, occurrence or development of a crack in the insulating layer can be effectively prevented when pressure is applied thereto by the substrate division. In many cases, a crack is less likely to occur or develop in a semiconductor layer than in an insulating layer; therefore, part of the semiconductor layer 110 is on the outermost surface in the cut portion 140; thus, occurrence of a crack can be effectively reduced.

The process of manufacturing the display device 100 includes a step of peeling a support substrate as described later. A crack caused by this peeling, which starts from an end portion of the substrate, can be effectively stopped in a region where the semiconductor layer 110 is provided.

As described above, by providing the semiconductor layer 110 to surround the display portion 102, cracks caused by the peeling step or the division step can be effectively prevented from developing into the display portion 102.

In addition, the conductive layer 120, which is positioned on an inner side than the semiconductor layer 110 and provided to surround the display portion 102, can prevent development of a crack that occurs in an end portion of the substrate when the display device 100 obtained by substrate division is bent. Accordingly, it is possible to improve the reliability of an electronic device in which the display device 100 is incorporated with a state where the display device 100 is bent or can be bent.

Note that in FIG. 1A and FIG. 2A, the semiconductor layer 110 and the conductive layer 120 surround the display portion 102, and form a closed curve (a curve with no ends, or a loop) when seen from above. In addition, the opening formed over the semiconductor layer 110 surrounds the display portion 102, is provided in and along a periphery of the substrate 101, and forms a closed curve (a curve with no ends, or a loop) when seen from above. The conductive layer 120 is not necessarily provided to form a closed curve and may be divided to form a dotted line. Furthermore, the conductive layer 120 may have a multiple line structure (i.e., the conductive layer 120 may be formed of two or more conductive layers). For example, in the case where the conductive layer 120 has a double line structure (the conductive layer 120 is formed of a first conductive layer and a second conductive layer), the structure is preferably as follows: the first conductive layer (a dotted line) and the second conductive layer (another dotted line) are placed in parallel; and an end of a part of the first conductive layer 120a (a dot of the dotted line) is not aligned with an end of a part of the second conductive layer (a dot of the other dotted line). This structure can prevent development of a crack because a crack cannot develop through spaces between the conductive layers.

In many cases, a crack is less likely to occur or develop in a semiconductor material used in the semiconductor layer 110 and a metal material used in the conductive layer 120 than in an insulating material. Even when a crack occurs in an insulating layer under the semiconductor layer 110 in an end portion of the substrate or an insulating layer under the conductive layer 120 in the end portion of the substrate, the crack can be effectively stopped in a region overlapping with the semiconductor layer 110 or the conductive layer 120.

Figure 3A:
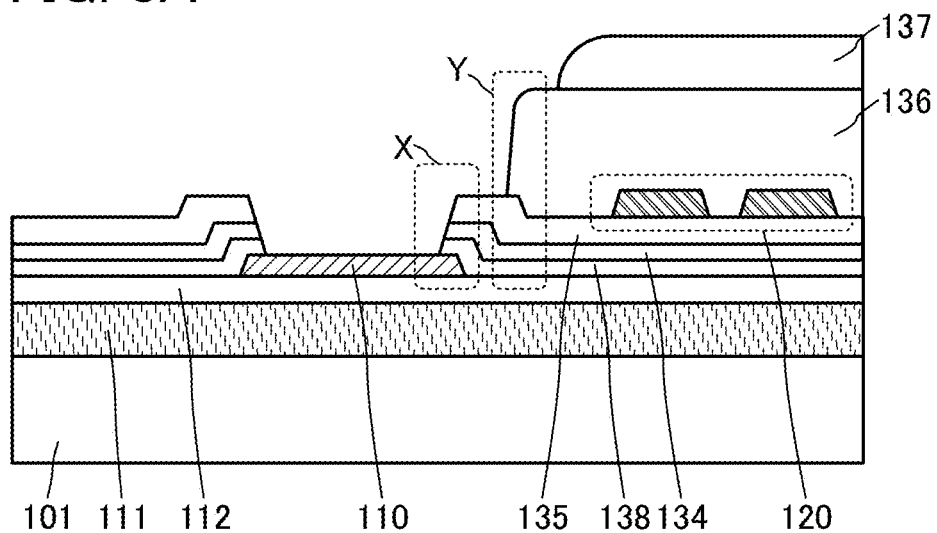
FIGS. 3A and 3B illustrate a structural example of a display device in Embodiment.
Figure 3B:
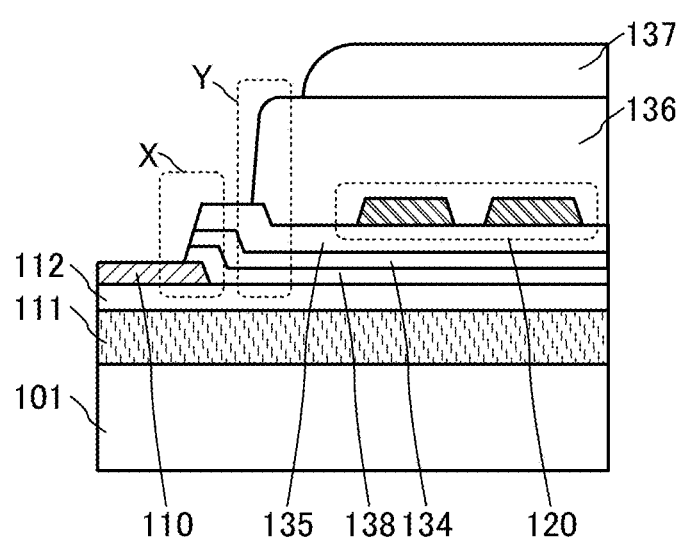

FIGS. 3A and 3B are enlarged views in the vicinity of the semiconductor layer 110. FIG. 3A shows the state before the substrate 101 is divided and FIG. 3B shows the state after the substrate 101 is divided.

The openings provided in the insulating layer 138, the insulating layer 134, and the insulating layer 135 are positioned on an inner side than the semiconductor layer 110. As shown by a region X denoted by the dotted line in FIGS. 3A and 3B, an end portion of the semiconductor layer 110 is covered with these insulating layers.

Here, development of a crack is described. Considered is the case where a component (with a single layer structure or a stacked structure) in which a crack occurs has two regions with different thicknesses, and a top surface of one region is positioned lower than a top surface of the other region (i.e., there is a step between the two regions). A crack tends to develop from the region having the higher top surface to the region having the lower top surface. In contrast, a crack hardly develops from the region having the lower top surface to the region having the higher top surface because the development of the crack is stopped by the step.

In the peeling step and the step of dividing the substrate 101, a crack in the display device 100 develops from an end portion of the substrate to the inner side (from the left to the light in FIGS. 3A and 3B). In a region where the semiconductor layer 110 is provided, a step is formed by end portions of the insulating layers 138, 134, and 135. Accordingly, even when a crack occurs in the region where the semiconductor layer 110 is provided, development of the crack is stopped by the step and the crack is prevented from developing into a region where the insulating layer 135 and the like are provided.

As shown by a region Y, an end portion of the insulating layer 136 is positioned on an inner side (on a closer side to the display portion 102) than the end portions of the insulating layer 135 and the like. The insulating layer 136 and the insulating layer 135 and the like also form a step. Consequently, even when a crack occurs in the insulating layer 135 and the like, this step can effectively stop development of the crack.

Similarly, the conductive layer 120 is provided over the insulating layer 135 and an end portion of the conductive layer 120 forms a step, which can avoid development of a crack. The development of a crack can be prevented more effectively particularly when two or more conductive layers 120 are arranged in parallel as shown in FIGS. 3A and 3B and other drawings because a plurality of steps can be formed by this structure.

Note that in the display device 100, the semiconductor layer 110 and the conductive layer 120 are provided to surround not only the display portion 102 but also the signal line driver circuit 103, the scan line driver circuit 104, the external connection terminal 105, and the like. This structure can prevent a crack that occurs in an end portion of the substrate 101 from reaching the display portion 102, the signal line driver circuit 103, the scan line driver circuit 104, and the external connection terminal 105; therefore, a malfunction of the display device 100 can be prevented.

In terms of reducing formation steps, the semiconductor layer 110 is preferably formed by processing the same semiconductor film as a semiconductor layer that forms a channel of a transistor. In addition, FIGS. 1A and 1B and FIGS. 2A and 2B illustrate the case where the conductive layer 120 is formed by processing the same conductive film as a pair of electrodes 133 in the transistor, but the present invention is not limited to this structure. The conductive layer 120 may be formed by processing the same conductive film as another electrode (e.g., a gate electrode 132) in the transistor, an electrode (e.g., a first electrode 141) in a display element, another wiring, or the like.

Other components of the display device 100 are described below with reference to FIG. 1B.

The external connection terminal 105 is formed using the same material as a conductive layer included in transistors or a light-emitting element in the display device 100. In the structure in Embodiment 1, the external connection terminal 105 is formed using the same material as a conductive layer that forms a source electrode and a drain electrode of the transistor. By the external connection terminal 105 on which an FPC or an IC is mounted via an anisotropic conductive film (ACF), an anisotropic conductive paste (ACP), or the like, a signal can be input.

FIG. 1B illustrates an example where a transistor 121 is included in the signal line driver circuit 103. The signal line driver circuit 103 may be, for example, a circuit in which an n-channel transistor and a p-channel transistor are used in combination, or a circuit that is formed of either n-channel transistors or p-channel transistors. The same applies to the scan line driver circuit 104. Although FIG. 1B illustrates an example of a driver-integrated structure in which the signal line driver circuit 103 and the scan line driver circuit 104 are formed over an insulating surface over which the display portion 102 is formed, the present invention is not limited to this structure. For example, a driver circuit IC may be used as the signal line driver circuit 103, the scan line driver circuit 104, or both and the driver circuit IC may be mounted on the substrate 101 by a chip on glass (COG) method or a chip on film (COF) method; alternatively, a flexible printed substrate (FPC) provided with the driver circuit IC by the COF method may be mounted on the substrate 101.

FIG. 1B illustrates a cross-sectional structure of one pixel as an example of the display portion 102. The pixel includes a switching transistor 123, a current control transistor 122, and the first electrode 141 electrically connected to one of the pair of electrodes 133 in the current control transistor 122. An insulating layer 137 is provided to cover a step of the first electrode 141. Under the insulating layer 137, the insulating layer 136 is provided to cover transistors.

The transistors (e.g., 121, 122, and 123) in the display device 100 are top-gate transistors. Each transistor includes a semiconductor layer 131 that functions as a source region and a drain region and has an impurity region; an insulating layer 138 that functions as a gate insulating layer; a gate electrode 132; the insulating layer 134 and the insulating layer 135 which are stacked to cover the gate electrode 132; and the pair of electrodes 133 electrically connected to the source region and the drain region in the semiconductor layer 131 via an opening formed in the insulating layer 134 and the insulating layer 135.

The light-emitting element 124 has a stacked structure in which the first electrode 141, an EL layer 142, and a second electrode 143 are stacked in this order over the insulating layer 136. Since the display device 100 in Embodiment 1 is a top emission display device, a light-transmitting material is used for the second electrode 143. A reflective material is preferably used for the first electrode 141. The EL layer 142 contains at least a light-emitting organic compound. When voltage is applied between the first electrode 141 and the second electrode 143 with the EL layer 142 interposed therebetween so that current flows in the EL layer 142, whereby the light-emitting element 124 can emit light.

A flexible substrate 130 is provided to face the substrate 101. The substrate 101 and the substrate 130 are bonded with a bonding layer 114 that is provided along the periphery of the substrate 130. A sealing layer 113 is provided on an inner side than the bonding layer 114. Note that a structure may be employed in which the substrate 101 and the substrate 130 are bonded with the sealing layer 113 without providing the bonding layer 114.

On a surface of the substrate 130 facing the light-emitting element 124, a color filter 145 is provided in a region overlapping with the light-emitting element 124 and a black matrix 146 is provided in a region overlapping with the insulating layer 137. Between the substrate 130 and each of the color filter 145 and the black matrix 146, an insulating layer having a function of inhibiting entry of impurities may be provided. On the other surface of the substrate 130 which does not face the light-emitting element 124, a transparent conductive film may be provided to form a touch sensor, or a flexible substrate having a function of a touch sensor may be attached.

[Material and Formation Method]

Materials and methods for forming the components described above are described below.

[Flexible Substrate]

As a material for the flexible substrate, an organic resin, a glass substrate thin enough to have flexibility, or the like can be used.

Examples of such materials are polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low, for example, lower than or equal to $30 \times 10^{-6}$/K is preferable, and a polyamide imide resin, a polyimide resin, or PET can be suitably used. A substrate in which a fibrous body is impregnated with a resin (also referred to as prepreg) or a substrate whose thermal expansion coefficient is reduced by mixing an inorganic filler with an organic resin can also be used.

In the case where a fibrous body is included in the above material, a high-strength fiber of an organic compound or an inorganic compound is used as the fibrous body. The high-strength fiber is specifically a fiber with a high tensile modulus of elasticity or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As an example of the glass fiber, a glass fiber using E glass, S glass, D glass, Q glass, or the like can be given. These fibers may be used in a state of a woven fabric or a nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

A material capable of transmitting light emitted from the EL layer 142 is used for the flexible substrate through which light emitted from the light-emitting element 124 is transmitted. To improve the outcoupling efficiency of the material provided on the light extraction side, the refractive index of the flexible, light-transmitting material is preferably high. For example, a substrate obtained by dispersing an inorganic filler having a high refractive index into an organic resin can have a higher refractive index than the substrate formed of only the organic resin. In particular, an inorganic filler having a particle diameter as small as 40 nm or less is preferably used, in which case such a filler can maintain optical transparency.

Since the substrate provided on the side opposite to the side through which light is transmitted does not need to have a light-transmitting property, a metal substrate, an alloy substrate, or the like can be used as well as the above substrates. To obtain flexibility and bendability, the thickness of a substrate is preferably greater than or equal to 10 µm and less than or equal to 200 µm, more preferably greater than or equal to 20 µm and less than or equal to 50 µm. Although there is no particular limitation on a material of the substrate, it is preferable to use, for example, aluminum, copper, nickel, a metal alloy such as an aluminum alloy or stainless steel. A conductive substrate containing a metal or an alloy material is preferably used as the flexible substrate provided on the side through which light is not transmitted, in which case heat dissipation of heat generated from the light-emitting element 124 can be increased.

In the case where a conductive substrate is used, it is preferable to use a substrate subjected to insulation treatment in such a manner that a surface of the substrate is oxidized or an insulating film is formed over the surface of the substrate. For example, an insulating film may be formed over the surface of the conductive substrate by an electrodeposition method, a coating method such as a spin-coating method or a dip method, a printing method such as a screen printing method, or a deposition method such as an evaporation method or a sputtering method. Alternatively, the surface of the substrate may be oxidized by being exposed to an oxygen atmosphere or heated in an oxygen atmosphere or by an anodic oxidation method.

In the case where the flexible substrate has an uneven surface, a planarization layer may be provided to cover the uneven surface so that a flat insulating surface is formed. An insulating material can be used for the planarization layer; an organic material or an inorganic material can be used. The planarization layer can be formed by a deposition method such as a sputtering method, a coating method such as a spin-coating method or a dip method, a discharging method such as an ink-jet method or a dispensing method, a printing method such as a screen printing method, or the like.

As the flexible substrate, a material in which a plurality of layers are stacked can also be used. For example, a material in which two or more kinds of layers formed of an organic resin are stacked, a material in which a layer formed of an organic resin and a layer formed of an inorganic material are stacked, or a material in which two or more kinds of layers formed of an inorganic material are stacked is used. With a layer formed of an inorganic material, moisture and the like are prevented from entering the inside, resulting in improved reliability of the display device.

As the inorganic material, an oxide material, a nitride material, or an oxynitride material of a metal or a semiconductor, or the like can be used. For example, silicon oxide, silicon nitride, silicon oxynitride, aluminum oxide, aluminum nitride, or aluminum oxynitride may be used.

For example, in the case where a layer formed of an organic resin and a layer formed of an inorganic material are stacked, the layer formed of an inorganic material can be formed over or under the layer formed of an organic resin by a sputtering method, a chemical vapor deposition (CVD) method, a coating method, or the like.

As the flexible substrate, a glass substrate thin enough to have flexibility may also be used. Specifically, it is preferable to use a sheet in which an organic resin layer, a bonding layer, and a glass layer are sequentially stacked from the side close to the light-emitting element 124. The thickness of the glass layer is greater than or equal to 20 µm and less than or equal to 200 µm, preferably greater than or equal to 25 µm and less than or equal to 100 µm. Such a thickness allows the glass layer to have both high flexibility and a high barrier property against water and oxygen. The thickness of the organic resin layer is greater than or equal to 10 µm and less than or equal to 200 µm, preferably greater than or equal to 20 µm and less than or equal to 50 µm. With such an organic resin layer in contact with the glass layer, breakage or a crack of the glass layer can be inhibited, resulting in increased mechanical strength. Forming the flexible substrate by using such a composite material of a glass material and an organic resin makes it possible to obtain a flexible display device with extremely high reliability.

[Light-Emitting Element]

A material that transmits light emitted from the EL layer 142 is used for an electrode on the light emission side in the light-emitting element 124.

As the light-transmitting material, indium oxide, indium oxide-tin oxide, indium oxide-zinc oxide, zinc oxide, and zinc oxide to which gallium is added can be used. Graphene may also be used. Other examples are a metal material such as gold, silver, platinum, magnesium, nickel, tungsten, chromium, molybdenum, iron, cobalt, copper, palladium, and titanium; and an alloy material containing any of these metal materials. A nitride of the metal material (e.g., titanium nitride) or the like may also be used. In the case of using the metal material (or the nitride thereof), the thickness is set small enough to be able to transmit light. Alternatively, a stack including any of the above materials can also be used as the conductive layer. For example, a stacked film including a silver-magnesium alloy and indium oxide-tin oxide is preferably used, in which case electrical conductivity can be increased.

Such an electrode is formed by an evaporation method, a sputtering method, or the like. A discharging method such as an ink-jet method, a printing method such as a screen printing method, or a plating method may be used.

Note that when the above conductive oxide having a light-transmitting property is formed by a sputtering method, the use of a deposition atmosphere containing argon and oxygen allows the light-transmitting property to be increased.

Further, in the case where the conductive oxide film is formed over the EL layer, a first conductive oxide film formed under an atmosphere containing argon with a reduced oxygen concentration and a second conductive oxide film formed under an atmosphere containing argon and oxygen are preferably stacked, in which case film formation damage to the EL layer can be reduced. In this case, in the formation of the first conductive oxide film, it is preferable to use an argon gas with high purity, for example, an argon gas whose dew point is lower than or equal to −70° C., more preferably lower than or equal to −100° C.

A material capable of reflecting light emitted from the EL layer 142 is preferably used for the electrode provided on the side opposite to the side through which light is transmitted.

As the light-reflecting material, for example, a metal such as aluminum, gold, platinum, silver, nickel, tungsten, chromium, molybdenum, iron, cobalt, copper, or palladium or an alloy containing any of these metals can be used. Alternatively, lanthanum, neodymium, germanium, or the like may be added to a metal or an alloy containing the metal material. In addition, any of the following can be used: alloys containing aluminum (aluminum alloys) such as an alloy of aluminum and titanium, an alloy of aluminum and nickel, and an alloy of aluminum and neodymium; and alloys containing silver such as an alloy of silver and copper, an alloy of silver, palladium, and copper, and an alloy of silver and magnesium. An alloy of silver and copper is preferable because of its high heat resistance. Further, by stacking a metal film or a metal oxide film in contact with an aluminum alloy film, oxidation of the aluminum alloy film can be suppressed. Examples of a material for the metal film or the metal oxide film are titanium and titanium oxide. Further alternatively, a stack including a film containing any of the above light-transmitting materials and a film containing any of the above metal materials may be used. For example, a stacked film including silver and indium oxide-tin oxide, a stacked film including a silver-magnesium alloy and indium oxide-tin oxide, or the like can be used.

Such an electrode is formed by an evaporation method, a sputtering method, or the like. A discharging method such as an ink-jet method, a printing method such as a screen printing method, or a plating method may be used.

The EL layer 142 includes at least a layer containing a light-emitting organic compound (hereinafter also called a light-emitting layer), and may be either a single layer or a stack including a plurality of layers. An example of the structure in which a plurality of layers is stacked is a structure in which a hole-injection layer, a hole-transport layer, a light-emitting layer, an electron-transport layer, and an electron-injection layer are stacked in this order from an anode side. Note that not all of these layers except the light-emitting layer are necessarily provided in the EL layer 142. Further, each of these layers may be provided in duplicate or more. Specifically, in the EL layer 142, a plurality of light-emitting layers may overlap each other or another hole-injection layer may overlap the electron-injection layer. Furthermore, another component such as an electron-relay layer may be added as appropriate as an intermediate layer, in addition to the charge generation layer. Alternatively, a plurality of light-emitting layers exhibiting different colors may be stacked. For example, a white emission can be obtained by stacking two or more layers emitting light of complementary colors.

The EL layer 142 can be formed by a vacuum evaporation method, a discharging method such as an ink-jet method or a dispensing method, or a coating method such as a spin-coating method.

[Bonding Layer and Sealing Layer]

As the bonding layer and the sealing layer, it is possible to use, for example, a gel or a curable material such as a two-component-mixture type resin, a thermosetting resin, or a light curable resin. For example, an epoxy resin, an acrylic resin, a silicone resin, a phenol resin, polyimide, polyvinyl chloride (PVC), polyvinyl butyral (PVB), or ethylene vinyl acetate (EVA) can be used. In particular, a material with low moisture permeability, such as an epoxy resin, is preferable.

A drying agent may be contained in the bonding layer and the sealing layer. For example, a substance that absorbs moisture by chemical adsorption, such as oxide of an alkaline earth metal (e.g., calcium oxide or barium oxide), can be used.

Alternatively, a substance that adsorbs moisture by physical adsorption, such as zeolite or silica gel, may be used as the drying agent. In the case where the drying agent is applied to a lighting device, when a granular drying agent is employed, light emitted from the light-emitting element 124 is diffusely reflected by the drying agent; thus, a highly reliable light-emitting device with improved viewing angle dependence, which is particularly useful for lighting and the like, can be achieved.

[Transistor]

There is no particular limitation on structures of transistors in the display portion 102, the signal line driver circuit 103, and the scan line driver circuit 104. For example, a forward staggered transistor, an inverted staggered transistor, or the like may be used. Furthermore, a top-gate transistor or a bottom-gate transistor may be used. In addition, a channel-etched transistor or a channel protective transistor may be used. In the case of a channel protective transistor, a channel protective film may be provided only over a channel region. Alternatively, an opening may be formed only in a portion where a source electrode and a drain electrode are in contact with a semiconductor layer and a channel protective film may be provided in an area other than the opening.

As a semiconductor applicable to a semiconductor layer in which a channel of a transistor is formed, for example, a semiconductor material such as silicon or germanium, a compound semiconductor material, an organic semiconductor material, or an oxide semiconductor material may be used.

There is no particular limitation on the crystallinity of a semiconductor used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of transistor characteristics can be reduced.

For example, in the case of using silicon as the semiconductor, amorphous silicon, microcrystalline silicon, polycrystalline silicon, single crystal silicon, or the like can be used.

In the case of using an oxide semiconductor as the semiconductor, an oxide semiconductor containing at least one of indium, gallium, and zinc is preferably used. Typically, an In—Ga—Zn-based metal oxide can be given. An oxide semiconductor having a wider band gap and a lower carrier density than silicon is preferably used, in which case off-state leakage current can be reduced.

The case of using a top-gate transistor is described in Embodiment 1, and the case of using a bottom-gate transistor is described in Embodiment 2.

[Layer to be Peeled and Insulating Layer]

The layer 112 has a function of inhibiting diffusion of impurities passing through the substrate 101 and the bonding layer 111. The layer 112 and the insulating layer 138, which are in contact with a semiconductor layer of a transistor, and the insulating layer 134 and the insulating layer 135, which cover a transistor, preferably prevent impurities from diffusing into the semiconductor layer. These insulating layers can be formed using, for example, oxide or nitride of a semiconductor such as silicon or oxide or nitride of metal such as aluminum. Alternatively, a stacked film of such an inorganic insulating material or a stacked film of such an inorganic insulating material and an organic insulating material may be used.

As the inorganic insulating material, for example, a single layer of or a stack including one or more materials selected from aluminum nitride, aluminum oxide, aluminum nitride oxide, aluminum oxynitride, magnesium oxide, gallium oxide, silicon nitride, silicon oxide, silicon nitride oxide, silicon oxynitride, germanium oxide, zirconium oxide, lanthanum oxide, neodymium oxide, and tantalum oxide. In this specification, the nitride oxide refers to a material containing a larger amount of nitrogen than oxygen, and the oxynitride refers to a material containing a larger amount of oxygen than nitrogen. The element content can be measured by, for example, RBS.

As the inorganic insulating material, a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide may be used.

The insulating layer 136 functions as a planarization layer covering steps formed due to a transistor, a wiring, or the like. For the insulating layer 136, for example, an organic resin such as polyimide, acrylic, polyamide, or epoxy or an inorganic insulating material can be used. It is preferable to use a photosensitive resin (e.g., acrylic or polyimide) for the insulating layer 136. The insulating layer 137 can be formed with the same material as the insulating layer 136.

[Color Filter and Black Matrix]

The color filter 145 is provided in order to adjust the color of light emitted from the light-emitting element 124 to increase the color purity. For example, in a full-color display device using white light-emitting elements, a plurality of pixels provided with color filters of different colors are used. In that case, the color filters may be those of three colors of red (R), green (G), and blue (B) or four colors (yellow (Y) in addition to these three colors). Further, a white (W) pixel may be added to R, G, and B pixels (and a Y pixel). That is, color filters of four colors (or five colors) may be used.

The black matrix 146 is provided between the adjacent color filters 145. The black matrix 146 shields a pixel from light emitted from the light-emitting element 124 in an adjacent pixel, thereby preventing color mixture between the adjacent pixels. When the color filter 145 is provided so that its end portion overlaps the black matrix 146, light leakage can be reduced. The black matrix 146 can be formed using a material that blocks light emitted from the light-emitting element 124, for example, a metal or an organic resin containing a pigment. Note that the black matrix 146 may be provided in a region other than the display portion 102, for example, in the signal line driver circuit 103.

An overcoat may be formed to cover the color filter 145 and the black matrix 146. The overcoat protects the color filter 145 and the black matrix 146 and suppresses the diffusion of impurities included in the color filter 145 and the black matrix 146. The overcoat is formed using a material that transmits light emitted from the light-emitting element 124, and can be formed using, for example, an inorganic insulating film or an organic insulating film.

An example where the display device has a top emission structure is described here, but a bottom emission structure may be employed. In the case of a bottom emission display device, the color filter 145 is provided closer to the substrate 101 than the light-emitting element 124 is. For example, the color filter 145 may be provided on the insulating layer 135 and the black matrix 146 may be provided to overlap with a transistor or the like.

Described in Embodiment 1 is a structure provided with a color filter, but a structure without using a color filter may be employed in which each pixel includes any one of light-emitting elements exhibiting light of different colors (e.g., R, G, and B).

The above is the description of the components.

Although a display device using a light-emitting element as a display element is described in Embodiment 1, another display device (e.g., a liquid crystal display device using a liquid crystal element or an electronic paper performing a display in an electrophoretic mode) may be employed. The liquid crystal display device is described in Embodiment 2.

[Example of Manufacturing Method]

An example of a method of manufacturing the display device 100 is described below with reference to drawings. In particular, an example of a method of manufacturing a plurality of display devices 100 from one substrate is described in Embodiment 1.

FIGS. 4A to 4D, FIGS. 5A to 5C, and FIGS. 6A and 6B are schematic cross-sectional views each illustrating a stage in a method of manufacturing the display device 100 described below. FIGS. 4A to 4D, FIGS. 5A to 5C, and FIG. 6A illustrate cross-sectional structures of the components in FIGS. 2A and 2B. FIG. 6B illustrates a cross-sectional structure of the components in FIGS. 1A and 1B.

[Formation of Peeling Layer]

First, a peeling layer 152 is formed over a support substrate 151.

A substrate having resistance high enough to withstand at least heat in a later step is used as the support substrate 151. Examples of the support substrate 151 include a glass substrate, a resin substrate, a semiconductor substrate, a metal substrate, and a ceramic substrate.

Note that it is preferable to use a large glass substrate as the support substrate 151 in terms of productivity. For example, a glass substrate having any of the following sizes or a larger size can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

A high-melting-point metal such as tungsten, titanium, or molybdenum can be used for the peeling layer 152. Tungsten is preferably used.

The peeling layer 152 can be formed by a sputtering method, for example.

[Formation of Layer to be Peeled]

Next, the layer 112 is formed over the peeling layer 152.

For the layer 112, an inorganic insulating material such as silicon oxide, silicon oxynitride, silicon nitride oxide, silicon nitride, or aluminum oxide can be used. The layer 112 can be a single layer or stacked layers containing the above inorganic insulating material.

In particular, it is preferable that the layer 112 have a stacked structure including two or more layers. In the stacked structure, at least one of the layers is preferably a layer that releases hydrogen when heated, and the closest layer to the peeling layer 152 is preferably a layer through which hydrogen passes. For example, the layer 112 has a stacked structure including a layer containing silicon oxynitride and a layer containing silicon nitride in this order from the peeling layer 152 side.

The layer 112 can be formed by a film formation method such as a sputtering method or a plasma CVD method. In particular, the layer 112 is preferably formed by a plasma CVD method using a deposition gas containing hydrogen.

A surface of the peeling layer 152 is oxidized when the layer 112 is formed, and as a result, an oxide layer (not shown) is formed between the peeling layer 152 and the layer 112. The oxide layer contains an oxide of the metal contained in the peeling layer 152. The oxide layer preferably contains tungsten oxide.

Tungsten oxide is generally represented by $WO_{(3-x)}$ and is a non-stoichiometric compound which can have a variety of compositions, typically $WO_3$, $W_2O_5$, $W_4O_{11}$, and $WO_2$. Titanium oxide $TiO_{(2-x)}$ and molybdenum oxide $MoO_{(3-x)}$ are also non-stoichiometric compounds.

The oxide layer at this stage preferably contains a large amount of oxygen. For example, in the case where tungsten is used for the peeling layer 152, the oxide layer is preferably a tungsten oxide layer containing $WO_3$ as its main component.

The oxide layer can also be formed over the surface of peeling layer 152 in advance by performing plasma treatment on the surface of the peeling layer 152 in an atmosphere containing an oxidized gas (preferably a dinitrogen monoxide gas) before the formation of the layer 112. When such a method is employed, the thickness of the oxide layer can vary depending on the conditions for the plasma treatment and the thickness of the oxide layer can be controlled more effectively than in the case where plasma treatment is not performed.

The thickness of the oxide layer is, for example, greater than or equal to 0.1 nm and less than or equal to 100 nm, preferably greater than or equal to 0.5 nm and less than or equal to 20 nm Note that the oxide layer with an extremely small thickness cannot be observed in a cross-sectional image in some cases.

[Heat Treatment]

Next, heat treatment is performed to change the quality of the oxide layer. By the heat treatment, hydrogen is released from the layer 112 to the oxide layer.

The metal oxide in the oxide layer is reduced by hydrogen supplied to the oxide layer, so that a plurality of regions with different proportions of oxygen are mixed in the oxide layer. For example, in the case where tungsten is used for the peeling layer 152, $WO_3$ in the oxide layer is reduced to generate an oxide with proportion of oxygen lower than that of $WO_3$ (e.g., $WO_2$), resulting in a state where $WO_3$ and the oxide with the lower proportion of oxygen are mixed. The crystal structure of such a metal oxide depends on the proportion of oxygen; thus, when a plurality of regions with different proportions of oxygen is provided in the oxide layer, the mechanical strength of the oxide layer is reduced. As a result, the oxide layer is likely to be damaged inside, so that the peelability in a later peeling step can be improved.

The heat treatment may be performed at a temperature higher than or equal to the temperature at which hydrogen is released from the layer 112 and lower than or equal to the temperature at which the support substrate 151 is softened. Furthermore, the heat treatment is preferably performed at a temperature higher than or equal to the temperature at which a reduction reaction between hydrogen and the metal oxide in the oxide layer occurs. For example, in the case where tungsten is used for the peeling layer 152, the heating temperature is higher than or equal to 420° C., higher than or equal to 450° C., higher than or equal to 600° C., or higher than or equal to 650° C.

The higher the temperature of the heat treatment is, the more the amount of hydrogen released from the layer 112 can be, leading to improved peelability. However, even when the heating temperature is reduced in consideration of the heat resistance of the support substrate 151 and the productivity, high peelability can be achieved by forming the oxide layer in advance by performing plasma treatment on the peeling layer 152 as described above.

[Formation of Semiconductor Layer]

A semiconductor film is formed over the layer 112. A resist mask is formed over the semiconductor film by a photolithography process or the like and unnecessary portions of the semiconductor film are etched. The resist mask is removed; thus, the semiconductor layer 131 that forms a transistor and the semiconductor layer 110 are formed (FIG. 4B).

The semiconductor film is formed by an appropriate method depending on a material. For example, a sputtering method, a CVD method, an MBE method, an atomic layer deposition (ALD) method, or a pulsed laser deposition (PLD) method can be used.

In the case where a polycrystalline silicon semiconductor film is used as the semiconductor film, a film of amorphous silicon is deposited and subjected to crystallization (e.g., laser light irradiation or heat treatment) to form a semiconductor film including polycrystalline silicon.

[Formation of Gate Insulating Layer]

The insulating layer 138 is formed to cover the semiconductor layer 110 and the semiconductor layer 131.

The insulating layer 138 can be formed by a plasma CVD method, a sputtering method, or the like.

[Formation of Gate Electrode]

A conductive film is formed over the insulating layer 138. A resist mask is formed over the conductive film by a photolithography process or the like and unnecessary portions of the conductive film are etched. The resist mask is removed; thus, the gate electrode 132 is formed.

At this time, wirings and the like which form a circuit may be formed simultaneously.

The conductive film to be the gate electrode 132 may be formed by a sputtering method, an evaporation method, a CVD method, or the like.

[Formation of Impurity Region]

An impurity is added to a region in the semiconductor layer 131 that forms a transistor, where the semiconductor layer 131 does not overlap with the gate electrode 132. As the dopant, an n-type dopant such as phosphorus or arsenic or a p-type dopant such as boron or aluminum can be used.

[Formation of Insulating Layer]

The insulating layer 134 and the insulating layer 135 are formed to cover the insulating layer 138 and the gate electrode 132.

The insulating layer 134 and the insulating layer 135 can be formed by a plasma CVD method, a sputtering method, or the like.

An insulating layer over the gate electrode 132 having a stacked structure of two layers (the insulating layers 134 and 135) is described in Embodiment 1, but the present invention is not limited to this structure. The insulating layer may have a single layer structure or a stacked structure of three or more layers.

[Formation of Opening]

An opening reaching the impurity region in the semiconductor layer 131 is formed in the insulating layers 138, 134, and 135. At this time, an opening that exposes part of a top surface of the semiconductor layer 110 is also formed in the insulating layers 138, 134, and 135 over the semiconductor layer 110 (FIG. 4C).

A resist mask is formed over the insulating layer 135 by a photolithography process or the like, and unnecessary portions of the insulating layers 138, 134, and 135 are etched. The resist mask is removed; thus, the openings are formed.

Since the semiconductor layer 110 is provided, the opening over the semiconductor layer 110 can be formed when the opening over the semiconductor layer 131 of the transistor is formed. In the case where the semiconductor layer 110 is not provided, for example, the layer 112 is also etched in the opening formation, and the opening reaches the peeling layer 152 in some cases. If a surface of the peeling layer 152 is exposed, film peeling might occur from the exposed portion. Thus, the semiconductor layer 110 has a function of an etching stopper for forming an opening in a stable manner.

[Formation of Source Electrode, Drain Electrode, and Conductive Layer]

A conductive film is formed over the above openings and the insulating layer 135. A resist mask is formed over the conductive film by a photolithography process or the like and unnecessary portions of the conductive film are etched. The resist mask is removed; thus, the electrodes 133 that function as a source electrode and a drain electrode of the transistor and the conductive layer 120 are formed (FIG. 4D).

At this time, wirings and the like which form a circuit may be formed simultaneously.

The conductive film is formed by a sputtering method, an evaporation method, a CVD method, or the like.

In FIG. 4D and other drawings, two conductive layers 120 are provided. One conductive layer 120 may be provided, but development of a crack can be effectively avoided when a plurality of conductive layers 120 is arranged in parallel with a gap as illustrated in FIG. 4D.

At this point, the transistors 121, 122, and 123 are completed.

[Formation of Insulating Layer]

The insulating layer 136 that functions as a planarization layer is formed. At this time, an opening reaching one of the electrodes 133 of the current control transistor 122, an opening reaching the semiconductor layer 110, and an opening reaching a wiring to be the external connection terminal 105 are formed in the insulating layer 136.

For example, the insulating layer 136 is preferably formed in such a manner that a photosensitive organic resin is applied by a spin coating method or the like, and then is subjected to selective light exposure and development. As another formation method, a sputtering method, an evaporation method, a droplet discharging method (e.g., an inkjet method), a printing method (e.g., a screen printing method or an offset printing method), or the like may be used.

[Formation of First Electrode]

A conductive film is formed over the insulating layer 136. A resist mask is formed over the conductive film by a photolithography process and an unnecessary portion of the conductive film is etched. The resist mask is removed; thus, the first electrode 141 electrically connected to one of the electrodes 133 of the transistor is formed.

At this time, wirings and the like which form a circuit may be formed simultaneously.

The conductive film is formed by a sputtering method, an evaporation method, a CVD method, or the like.

[Formation of Insulating Layer]

The insulating layer 137 covering an end portion of the first electrode 141 is formed (FIG. 5A). At this time, an opening reaching the semiconductor layer 110 and an opening reaching the wiring to be the external connection terminal 105 are formed in the insulating layer 137.

For example, the insulating layer 137 is preferably formed in such a manner that a photosensitive organic resin is applied by a spin coating method or the like, and then is subjected to selective light exposure and development. As another formation method, a sputtering method, an evaporation method, a droplet discharging method (e.g., an inkjet method), a printing method (e.g., a screen printing method or an offset printing method), or the like may be used.

[Peeling]

Peeling is performed between the peeling layer 152 and the layer 112 (FIG. 5B).

For the peeling, for example, the support substrate 151 is fixed to a suction stage and a peeling starting point is formed between the peeling layer 152 and the layer 112. The peeling starting point may be formed by, for example, inserting a sharp instrument such as a knife between the layers. Alternatively, the peeling starting point may be formed by irradiating part of the peeling layer 152 with laser light to melt, evaporate, or thermally break the part of the peeling layer 152. Further alternatively, the peeling starting point may be formed by dripping liquid (e.g., alcohol, water, or water containing carbon dioxide) onto an end portion of the peeling layer 152 so that the liquid penetrates into an interface between the peeling layer 152 and the layer 112 by using capillary action.

Then, physical force is gently applied to the area where the peeling starting point is formed in a direction substantially perpendicular to the bonded surfaces, so that peeling can be caused without damage to the layer 112 and layers provided thereover.

To protect components formed over the layer 112, such as a transistor, in the peeling step, it is preferable that a flexible base material or the like be attached to the layer 112 with a bonding layer (e.g., a water-soluble adhesive or a low-viscosity adhesive) that can be removed.

For example, peeling may be caused by attaching tape or the like to the support substrate 151 or the base material and pulling the tape in the aforementioned direction. Alternatively, peeling may be caused by pulling an end portion of the support substrate 151 or the base material with a hook-like member. Further alternatively, peeling may be caused by pulling an adhesive member or a member capable of vacuum suction attached to the back side of the support substrate 151 or the base material. Still further alternatively, peeling may be caused by pressing an adhesive roller to the back side of the support substrate 151 or the base material and rolling and moving the roller relatively.

Here, peeling is performed in such a manner that liquid containing water such as water or an aqueous solution is added to the peeling interface and the liquid penetrates into the peeling interface, so that the peelability can be improved.

Peeling mainly occurs in an oxide layer formed between the peeling layer 152 and the layer 112 or at an interface between the oxide layer and the peeling layer 152. Thus, after the peeling, the oxide layer is attached to a surface of the peeling layer 152 and a surface of the layer 112 in some cases. Since peeling is likely to occur at the interface between the oxide layer and the peeling layer 152 as described above, the thickness of the oxide layer attached to the layer 112 is larger than that of the oxide layer attached to the peeling layer 152 in many cases.

It is preferable that a peeling starting point be formed in an end portion of the support substrate 151 so that the peeling proceeds from the end portion. In formation of the peeling starting point, a crack occurs in some cases in the insulating layer over the layer 112 near the end portion of the support substrate 151. The crack formed at this time might develop from the outer side to the inner side of the support substrate 151, as the peeling proceeds. However, even when such a crack occurs, development of the crack can be stopped in a region where the semiconductor layer 110 surrounding the display portion 102 is provided; thus, the crack can be effectively prevented from reaching the display portion 102.

[Bonding]

The flexible substrate 101 is bonded to the surface of the layer 112 on which peeling has been performed, with the bonding layer 111 interposed therebetween.

In the case where before the peeling, a flexible base material is attached to the layer 112 with a bonding layer that can be removed, the flexible base material and the bonding layer are removed at this step.

[Formation of Light-Emitting Element]

The EL layer 142 and the second electrode 143 are sequentially formed over the first electrode 141; thus the light-emitting element 124 is formed (FIG. 5C).

Through the above steps, a plurality of transistors and the light-emitting element 124 can be provided over the flexible substrate 101.

[Bonding]

The substrate 130 provided with the color filter 145 and the black matrix 146 is prepared.

The color filter 145 and the black matrix 146 can be formed on the flexible substrate 130 in a manner similar to that of the insulating layer 136 and the insulating layer 137. The color filter 145 and the black matrix 146 may be formed directly on the flexible substrate 130. Alternatively, the color filter 145 and the black matrix 146 may be formed over the flexible substrate 130 using the aforementioned peeling method: a peeling layer and a layer to be peeled are formed over a support substrate, the color filter 145 and the black matrix 146 are formed over the layer to be peeled, the support substrate and the peeling layer are separated from the layer to be peeled and the other components (including the color filter 145 and the black matrix 146), and the layer to be peeled is bonded to the flexible substrate 130 with a bonding layer.

A bonding layer 114 is formed over the substrate 130 or the substrate 101.

A curable resin is applied by, for example, a discharging method such as a dispensing method or a printing method such as a screen printing method, and a solvent in the resin is vaporized; thus, the bonding layer 114 is formed.

The sealing layer 113 is formed on an inner side than the bonding layer 114, over the substrate 130 or the substrate 101. The sealing layer 113 can be formed by a method similar to that of the bonding layer 114.

The bonding layer 114 functions as a partition wall (also referred to as bank or barrier) that prevents the sealing layer 113 from spreading to a region where the external connection terminal 105 or the semiconductor layer 110 is provided. When there is no possibility that the sealing layer 113 spreads to the region where the external connection terminal 105 or the semiconductor layer 110 is provided in view of a material or a formation method of the sealing layer 113 or a region where the sealing layer 113 is provided, the bonding layer 114 is not necessarily provided.

The substrate 130 is attached to the substrate 101, and the bonding layer 114 and the sealing layer 113 are cured, whereby the substrate 130 is bonded to the substrate 101 (FIG. 6A).

At this time, if the substrate 130 that is cut out in an appropriate size is bonded to each of the display devices 100 formed over the substrate 101, the process becomes complicated and the productivity decreases. For this reason, it is preferable to perform the followings as illustrated in FIG. 6A: a substrate having about the same size as the substrate 101 is used as the substrate 130; the substrate 130 is attached to the substrate 101 so as to cover the plurality of display devices 100; and the substrate 130 and the substrate 101 are cut so that the plurality of display devices 100 is separated into individual devices.

[Division]

The substrate 101 and the substrate 130 are cut so that the plurality of display devices 100 is separated into individual devices (FIG. 6B).

For cutting the substrate 101 and the substrate 130, a cutter knife with a sharp blade, a scriber, or a laser cutter can be used. In the case where the substrate 101 and the substrate 130 are cut in the same position, a shearing machine may be used, for example.

The substrate 101 is cut along the openings formed in the insulating layers (134, 135, 136, 137, and 138) over the semiconductor layer 110.

The substrate 130 is cut in a region on an inner side than at least the external connection terminal 105 not to overlap with the external connection terminal 105. Note that the substrate 130 in a region where the external connection terminal 105 is not provided may be cut in the same positions as the substrate 101.

Through the above steps, the display device 100 can be manufactured.

Note that the case where a metal material is used for the peeling layer and an inorganic insulating material is used for the layer to be peeled is described in the above manufacturing method, but a combination of the materials of the peeling layer and the layer to be peeled is not limited thereto. Materials of the peeling layer and the layer to be peeled are selected such that peeling is performed at an interface between the peeling layer and the layer to be peeled or in the peeling layer. For example, a combination of low adhesive materials (e.g., a metal and a resin) may be employed.

The peeling layer is not necessary in the case where peeling can occur at an interface between the support substrate and the layer to be peeled. For example, glass is used as the support substrate, an organic resin such as polyimide is used as the layer to be peeled, and peeling is performed by heating the organic resin. Alternatively, a metal layer may be provided between the support substrate and the layer to be peeled formed of an organic resin, and peeling may be performed at the interface between the metal layer and the layer to be peeled formed of an organic resin by heating the metal layer by feeding a current to the metal layer.

The case where the EL layer 142 and the second electrode 143 are formed after the peeling is described in the above manufacturing method, but the EL layer 142 and the second electrode 143 may be formed before the peeling.

When the EL layer 142 is formed by a vacuum evaporation method, it might be difficult to form the EL layer 142 stably over an extremely large substrate because of bending of the substrate or the like. In such a case, the substrate is preferably divided into pieces with desired sizes before formation of the EL layer 142. At this time, it is preferable that the substrate be not divided into small pieces each including one display device 100, but be divided into pieces each including a plurality of display devices 100, and evaporation be performed simultaneously to the plurality of display devices 100.

In the case where the substrate division is performed in two steps (substrate division before formation of the EL layer 142 and substrate division for separating the plurality of display devices 100 into individual display device 100), it is preferable to form the semiconductor layer 110 along division lines for the respective steps. For example, the semiconductor layer 110 that surrounds each display device 100 and the semiconductor layer 110 that surrounds a region including the plurality of display devices 100 are doubly provided.

By the above manufacturing method, flexible devices with fewer defects caused by a crack can be manufactured with high productivity.

This embodiment can be combined with any of the other embodiments and examples described in this specification as appropriate.

Embodiment 2

In this embodiment, a structure of a display device that differs from the display device shown in Embodiment 1 is described as an example. Note that description of the portions described in Embodiment 1 is omitted.

Structural Example

An example of a structure of an image display device in which a liquid crystal element is used as a display element is described below.

Figure 7:
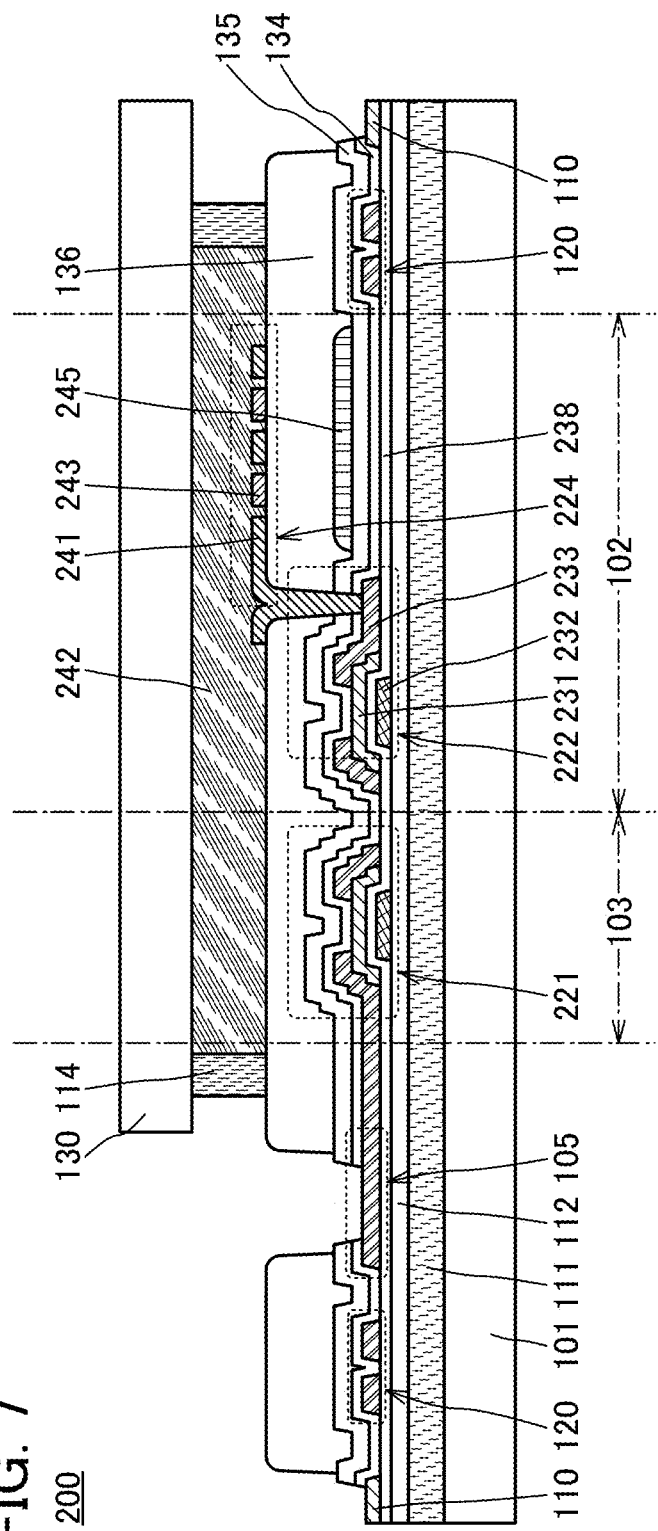
FIG. 7 illustrates a structural example of a display device in Embodiment.

FIG. 7 is a schematic cross-sectional view of a display device 200. The display device 200 differs from the display device 100 described in Embodiment 1 mainly in that a liquid crystal element is used as a display element and a transistor has a different structure.

The display portion 102 includes a liquid crystal element 224 using an in-plane switching (IPS) mode. In the liquid crystal element 224, the orientation of a liquid crystal is controlled by an electric field generated in a direction parallel to the substrate surface.

A pixel includes at least one switching transistor 222 and a storage capacitor that is not illustrated. A comb-shaped second electrode 243 and a comb-shaped first electrode 241 electrically connected to one of a source electrode and a drain electrode of the transistor 222 are provided apart from each other over the insulating layer 136.

For at least one of the first electrode 241 and the second electrode 243, any of the above-described light-transmitting conductive materials is used. It is preferable to use a light-transmitting conductive material for both of these electrodes because the aperture ratio of the pixel can be increased.

Although the first electrode 241 and the second electrode 243 are distinguished from each other in FIG. 7 by using different hatch patterns, these electrode layers are preferably formed by processing the same conductive film.

A color filter 245 is provided at a position overlapping with the first electrode 241 and the second electrode 243. The color filter 245 is provided over the insulating layer 135 in FIG. 7, but the position of the color filter is not limited to this position.

A liquid crystal 242 is provided between the substrate 130 and each of the first electrode 241 and the second electrode 243. An image can be displayed in the following way: an electric field is generated in the horizontal direction by application of voltage between the first electrode 241 and the second electrode 243, orientation of the liquid crystal 242 is controlled by the electric field, and polarization of light from a backlight provided outside the display device is controlled in each pixel.

It is preferable to provide alignment films for controlling the orientation of the liquid crystal 242 on surfaces in contact with the liquid crystal 242. A light-transmitting material is used for the alignment films. Although not illustrated here, polarizing plates are provided on an outside surface of the substrate 101 and an outside surface of the substrate 130 with respect to the liquid crystal element 224.

As the liquid crystal 242, a thermotropic liquid crystal, a low-molecular liquid crystal, a high-molecular liquid crystal, a ferroelectric liquid crystal, an anti-ferroelectric liquid crystal, or the like can be used. Moreover, a liquid crystal exhibiting a blue phase is preferably used, in which case an alignment film is not needed and a wide viewing angle can be obtained.

A high-viscosity and low-fluidity material is preferably used for the liquid crystal 242.

Although the liquid crystal element 224 using IPS mode is described here as an example, the mode of the liquid crystal element is not limited to this, and a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Transistors (e.g., a transistor 221 and the transistor 222) provided in the display device 200 are bottom-gate transistors. Each of the transistors includes a gate electrode 232, an insulating layer 238 functioning as a gate insulating layer, a semiconductor layer 231, and a pair of electrodes 233. In addition, the insulating layers 134, 135, and 136 are provided to cover the transistors.

The semiconductor layer 110 illustrated in FIG. 7 is formed by processing the same film as the semiconductor layer 231 of the transistor. A structure of the transistor in the display device 200 is different from the structure of the transistor in the display device 100 described in Embodiment 1, and a stacked structure around the semiconductor layer 110 and the conductive layer 120 is different from that in the display device 100.

Specifically, the semiconductor layer 110 is formed over the insulating layer 238 functioning as a gate insulating layer, and the end portion of the semiconductor layer 110 is covered with the insulating layers 134 and 135. The conductive layer 120 is provided over the insulating layer 238, and the insulating layers 134 and 135 are provided over the conductive layer 120.

The above is the description on the example of the structure of Embodiment 2.

Note that the bottom-gate transistor described here can be replaced with the top-gate transistor described in Embodiment 1. Alternatively, the transistor described in Embodiment 1 can be replaced with the bottom-gate transistor described here. The stacked structure around the semiconductor layer 110 and the conductive layer 120 inevitably changes in accordance with the structure of the transistor.

This embodiment can be combined with any of the other embodiments and examples described in this specification as appropriate.

Embodiment 3

In this embodiment, electronic devices each including a display device are described as examples of a semiconductor device of one embodiment of the present invention.

The display device of one embodiment of the present invention has a bendable display surface. Examples of such a display device include a television set (also referred to as television or television receiver), a monitor of a computer, a camera such as a digital camera or a digital video camera, a digital photo frame, a mobile phone set (also referred to as mobile phone or mobile phone device), a portable game machine, a portable information terminal, an audio reproducing device, and a large game machine such as a pachinko machine. In addition, a lighting device or a display device can be incorporated along a curved inside/outside wall surface of a house or a building or a curved interior/exterior surface of a car. In addition, a lighting device or a display device can be incorporated along a curved inside/outside wall surface of a house or a building or a curved interior/exterior surface of a car.

Figure 8A:
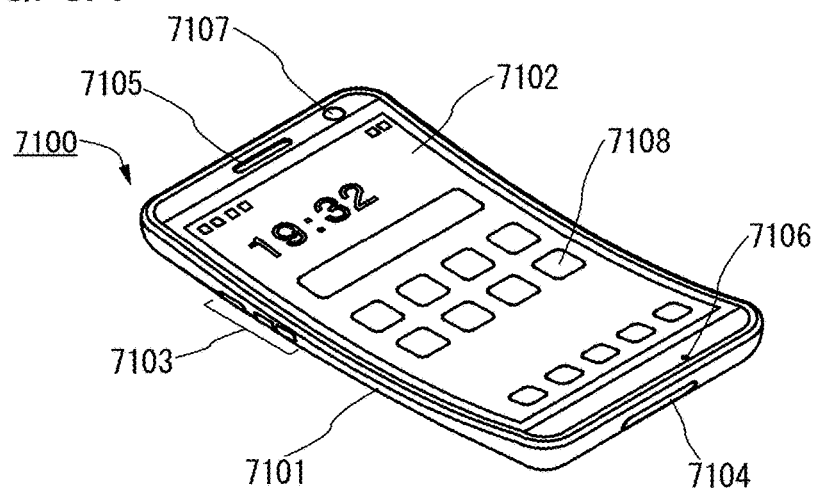
FIGS. 8A to 8C illustrate structure examples of electronic devices in Embodiment.

FIG. 8A illustrates an example of a mobile phone. A mobile phone 7100 includes a display portion 7102 incorporated in a housing 7101, operation buttons 7103, an external connection port 7104, a speaker 7105, a microphone 7106, a camera 7107, and the like. Note that the mobile phone 7100 is manufactured using the display device of one embodiment of the present invention for the display portion 7102.

When the display portion 7102 of the mobile phone 7100 illustrated in FIG. 8A is touched with a finger or the like, data can be input to the mobile phone 7100. Operations such as making a call and entering a character can be performed by touch on the display portion 7102 with a finger or the like. For example, by touching an icon 7108 displayed on the display portion 7102, application can be started.

The power can be turned on or off with the operation buttons 7103. In addition, types of images displayed on the display portion 7102 can be switched; for example, switching images from a mail creation screen to a main menu screen.

Here, the display portion 7102 includes the display device of one embodiment of the present invention. Thus, images can be displayed on the bent display surface, and the mobile phone can have high reliability.

Figure 8B:
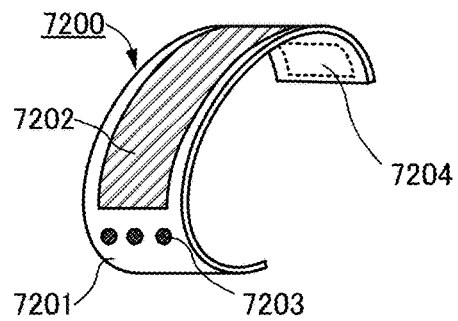

FIG. 8B is an example of a wristband-type display device. A portable display device 7200 includes a housing 7201, a display portion 7202, an operation button 7203, and a sending and receiving device 7204.

The portable display device 7200 can receive a video signal with the sending and receiving device 7204 and can display the received video on the display portion 7202. In addition, with the sending and receiving device 7204, the portable display device 7200 can send an audio signal to another receiving device.

With the operation button 7203, power ON/OFF, switching of displayed videos, adjusting volume, and the like can be performed.

Here, the display portion 7202 includes the display device of one embodiment of the present invention. Thus, the portable display device can have a curved display portion and high reliability.

Figure 8C:
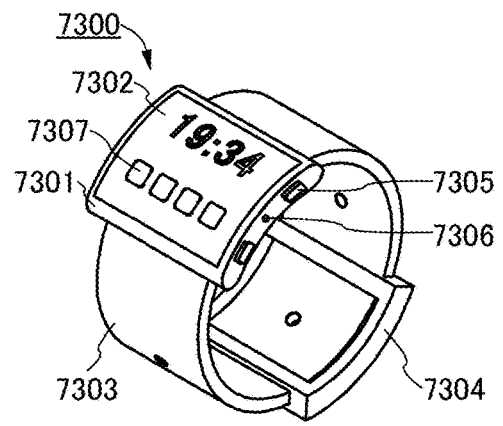

FIG. 8C illustrates an example of a wrist-watch-type portable information terminal A portable information terminal 7300 includes a housing 7301, a display portion 7302, a band 7303, a buckle 7304, an operation button 7305, an input output terminal 7306, and the like.

The portable information terminal 7300 is capable of executing a variety of applications such as mobile phone calls, e-mailing, viewing and editing texts, music reproduction, Internet communication, and a computer game.

The display surface of the display portion 7302 is bent, and images can be displayed on the bent display surface. The display portion 7302 includes a touch sensor, and operation control can be performed by touching the screen with a finger, a stylus, or the like. For example, by touching an icon 7307 displayed on the display portion 7302, application can be started.

With the operation button 7305, a variety of functions such as time setting, power ON/OFF, ON/OFF of wireless communication, setting and cancellation of manner mode, and setting and cancellation of power saving mode can be performed. For example, the functions of the operation button 7305 can be set freely by setting the operation system incorporated in the portable information terminal 7300.

The portable information terminal 7300 can employ near field communication that is a communication method in accordance with an existing communication standard. For example, mutual communication between the portable information terminal 7300 and a headset capable of wireless communication can be performed, and thus hands-free calling is possible.

The portable information terminal 7300 includes the input output terminal 7306, and data can be directly transmitted to and received from another information terminal via a connector. Power charging through the input output terminal 7306 is possible. Note that the charging operation may be performed by wireless power feeding without using the input output terminal 7306.

The display device of one embodiment of the present invention can be used in the display portion 7302 of the portable information terminal 7300.

The display device of one embodiment of the present invention can be used in any of the display portions of the electronic devices described in this embodiment. Accordingly, a highly reliable electronic device that can display images on a curved surface and has fewer defects due to bending can be achieved.

This embodiment can be combined with any of the other embodiments and examples described in this specification as appropriate.

Example

In this example, a semiconductor layer and a conductive layer, each of which is one embodiment of the present invention, were formed over a flexible substrate, and a crack was observed before and after the substrate is divided. The results are described below.

[Fabrication of Sample]

First, an approximately 200-nm-thick silicon oxynitride film was formed over a glass substrate functioning as a support substrate by a plasma CVD method. Next, an approximately 50-nm-thick tungsten film was formed as a peeling layer by a sputtering method. Then, an approximately 600-nm-thick silicon oxynitride film, an approximately 200-nm-thick silicon nitride film, an approximately 200-nm-thick silicon oxynitride film, an approximately 140-nm-thick silicon nitride oxide film, and an approximately 100-nm-thick silicon oxynitride film were successively formed by a plasma CVD method as a layer to be peeled (hereinafter referred to as layer).

An approximately 50-nm-thick polysilicon film was formed over the layer, and unnecessary portions were etched, whereby a semiconductor layer of a transistor and a semiconductor layer that surrounds the transistor were formed. To form the polysilicon film, an amorphous silicon film was formed by a plasma CVD method, solid-phase growth using Ni as a catalytic element was performed on the amorphous silicon film, and the catalytic element that remained in the film was removed.

Next, an approximately 110-nm-thick silicon oxynitride film was formed as a gate insulating layer by a plasma CVD method. Then, an approximately 30-nm-thick tantalum nitride film and an approximately 370-nm-thick tungsten film were formed, and unnecessary portions were etched, whereby a gate electrode was formed. An approximately 50-nm-thick silicon oxynitride film, an approximately 140-nm-thick silicon nitride oxide film, and an approximately 520-nm-thick silicon oxynitride film were formed as an interlayer insulating layer. After that, the gate insulating layer and the interlayer insulating layer were partly etched to form an opening such that an end portion of the semiconductor layer was covered and part of the semiconductor layer was exposed. Note that the insulating layers where the opening was formed are collectively called a first insulating layer.

An approximately 100-nm-thick titanium film, an approximately 700-nm-thick aluminum film, and an approximately 100-nm-thick titanium film were formed over the interlayer insulating layer by a sputtering method, and unnecessary portions were etched, whereby a pair of electrodes of the transistor and a conductive layer that surrounds the transistor were formed.

An approximately 150-nm-thick silicon oxynitride film was formed, and an opening was formed over the semiconductor layer in a manner similar to the above-described manner. Next, an approximately 2.0-µm-thick polyimide film was formed by a photolithography process such that an opening was formed over the semiconductor layer. Then, an approximately 50-nm-thick indium-tin oxide film was formed by a sputtering method and unnecessary portions were etched to form a first electrode. After that, an approximately 1.5-µm-thick polyimide film was formed by a photolithography process such that an opening was formed over the semiconductor layer. Note that the silicon oxynitride film and the two-layered polyimide film which were formed over the conductive layer are collectively called as a second insulating layer.

Next, a water-soluble resin was applied and cured. A UV-peeling tape whose adhesion is weakened by ultraviolet light irradiation was attached, the UV-peeling tape side was held by a suction stage, and the layer was separated from the support substrate. A curable epoxy resin was applied onto a surface of the layer on which peeling had been performed, and a 125-µm-thick polyimide film was attached thereto as a substrate. After that, the UV-peeling tape was peeled and then the water-soluble resin was removed.

Through the above steps, a sample including, over a flexible substrate, a transistor; a conductive layer surrounding a region where the transistor is formed; and a semiconductor layer positioned on an outer side than the conductive layer was fabricated.

[Observation of Crack]

Before and after the substrate division, the vicinity of the semiconductor layer and the conductive layer was observed with an optical microscope.

FIGS. 9A to 12A are optical micrographs. A schematic cross-sectional structure (FIGS. 9B to 12B) of the observed portion is shown below each optical micrograph.

Figure 9A:
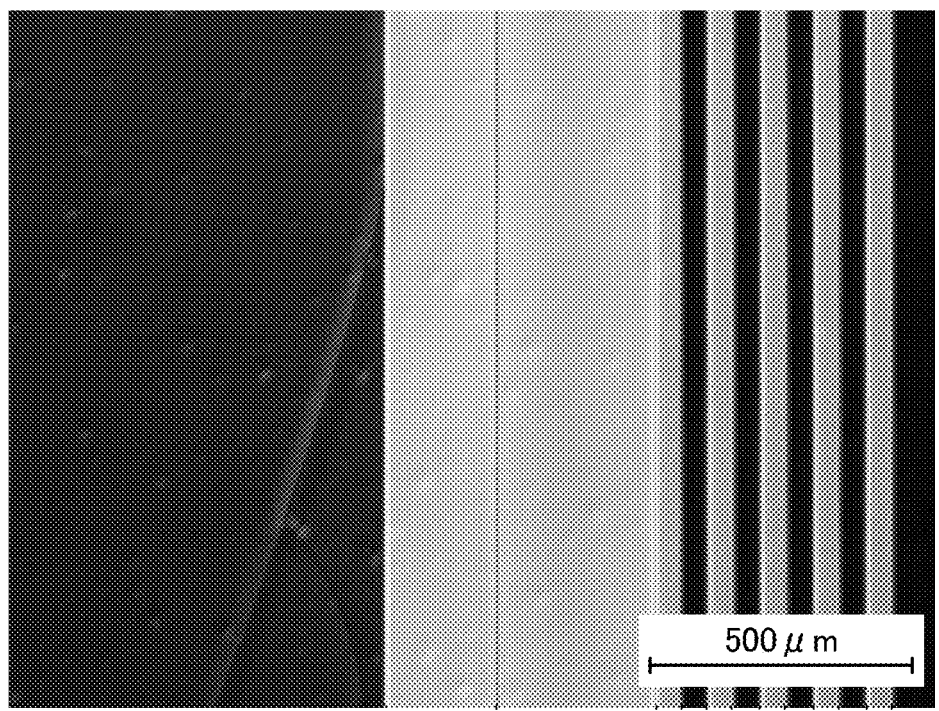
FIGS. 9A and 9B are an optical micrograph of a sample and a cross sectional view of the sample in Example.
Figure 9B:
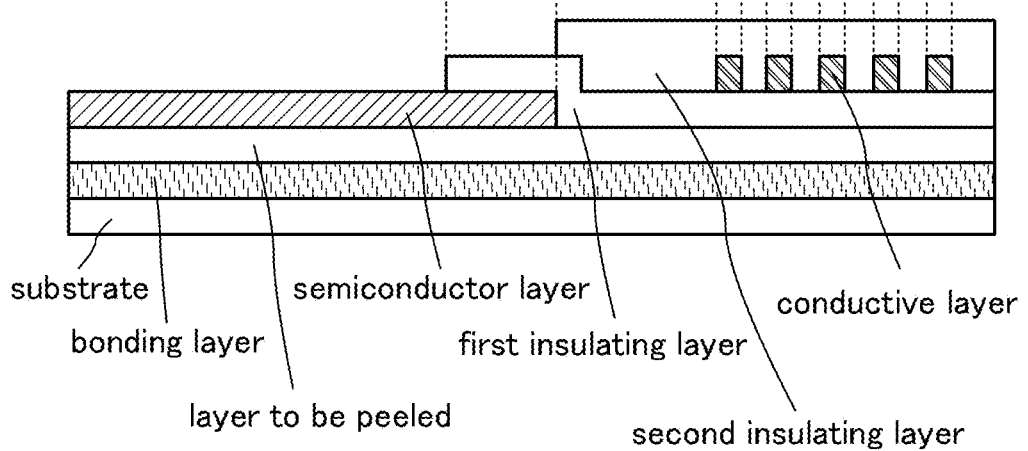

FIG. 9A is an optical micrograph taken before the substrate division. The left side shows a region where the semiconductor layer is exposed, and a crack occurs in this region. This crack is not developed into an inner side (the right side) than an end portion of the first insulating layer which overlaps with the semiconductor layer.

Figure 10A:
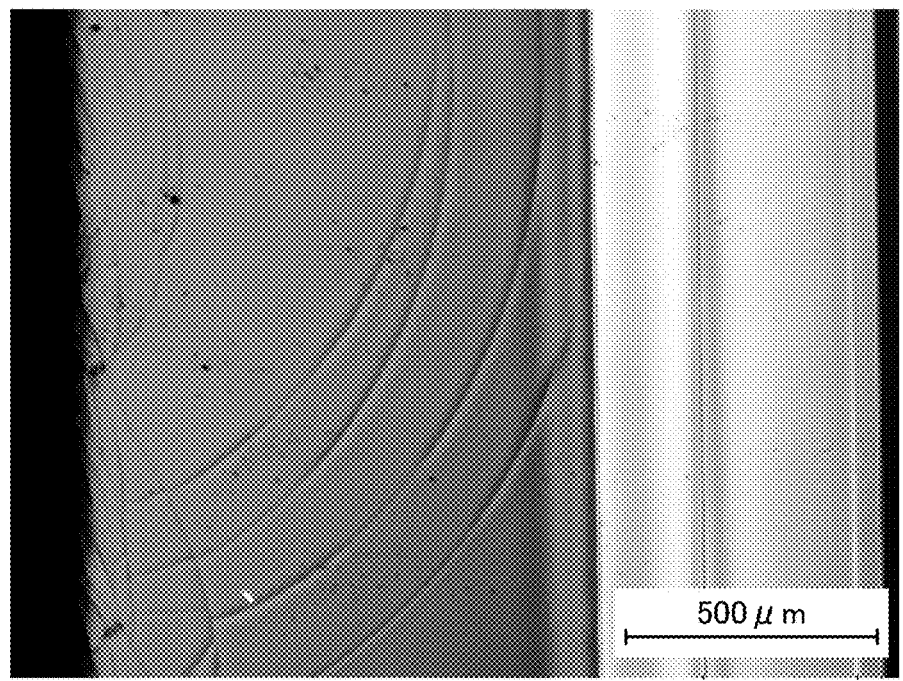
FIGS. 10A and 10B are an optical micrograph of a sample and a cross sectional view of the sample in Example.
Figure 10B:
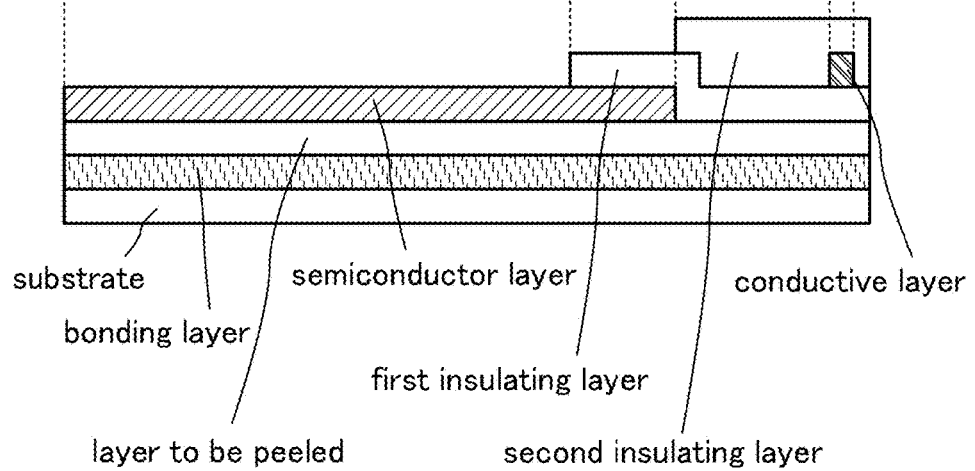
Figure 11A:
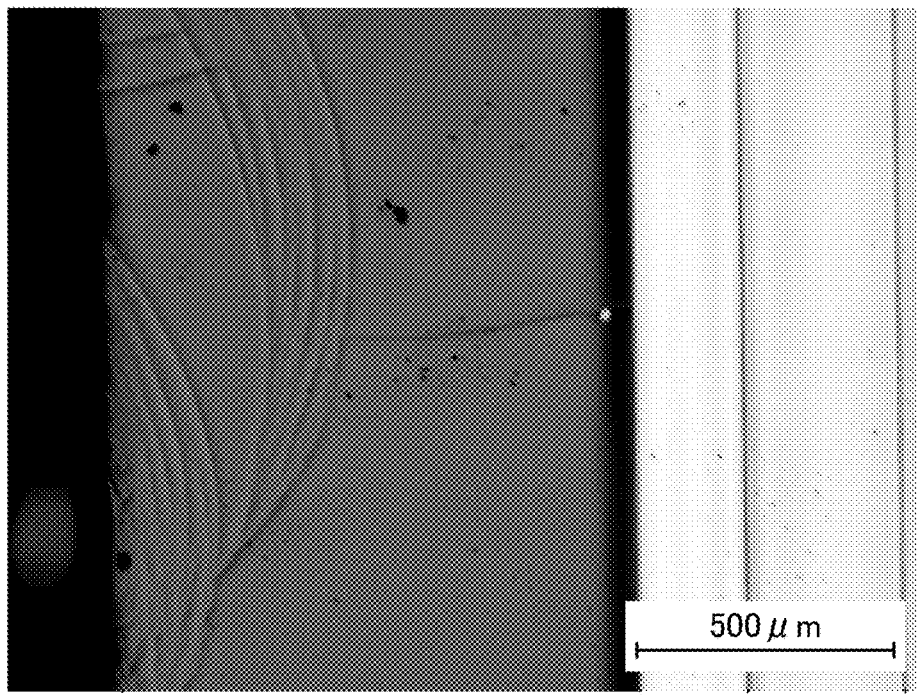
FIGS. 11A and 11B are an optical micrograph of a sample and a cross sectional view of the sample in Example.
Figure 11B:
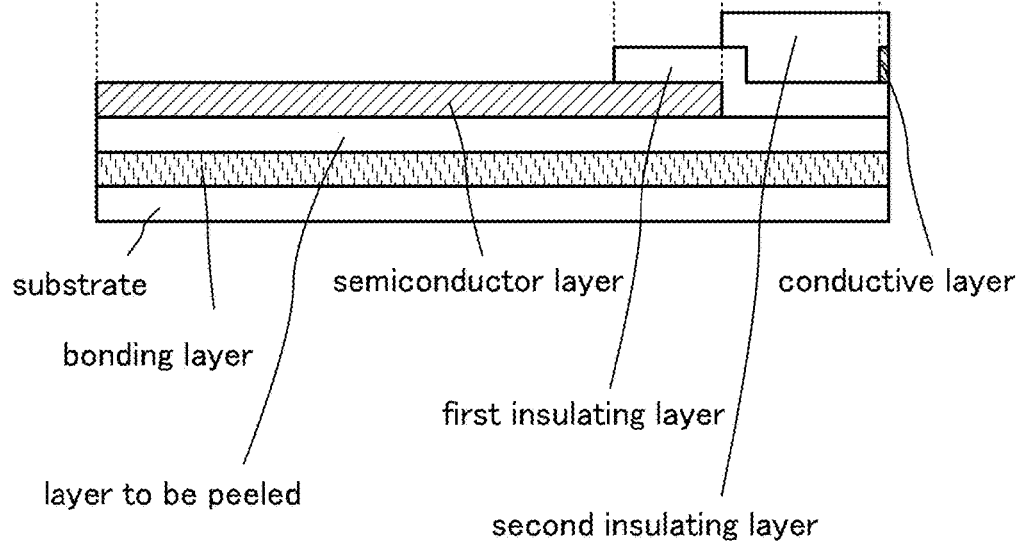

FIG. 10A and FIG. 11A are each an optical micrograph taken when the substrate is cut in a region where an opening overlaps with the semiconductor layer. In each of the optical micrographs, a crack develops from the cut portion of the substrate (on the left side in the micrograph) into an inner side. In addition, as in FIG. 9A, the development of the crack is stopped at an end portion of the first insulating layer which overlaps with the semiconductor layer.

Figure 12A:
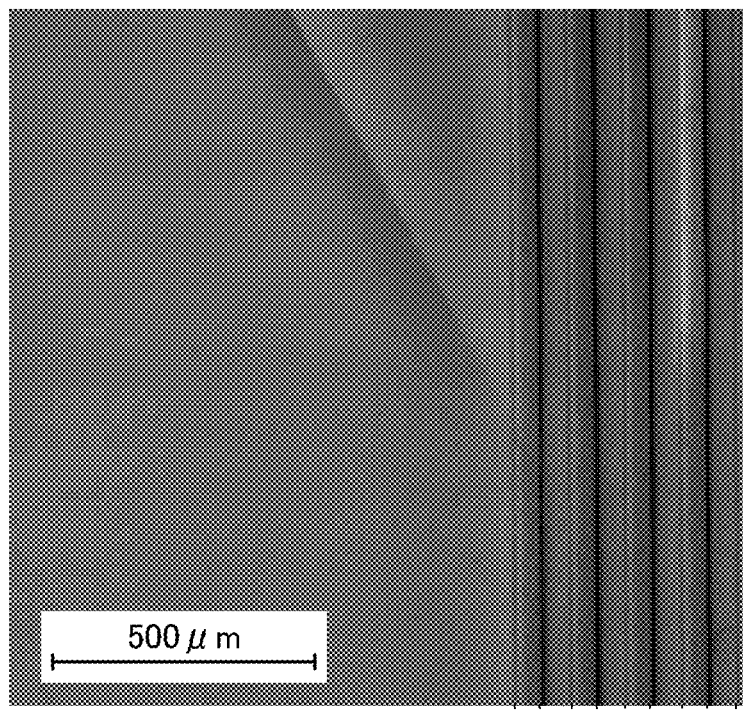
FIGS. 12A and 12B are an optical micrograph of a sample and a cross sectional view of the sample in Example.
Figure 12B:
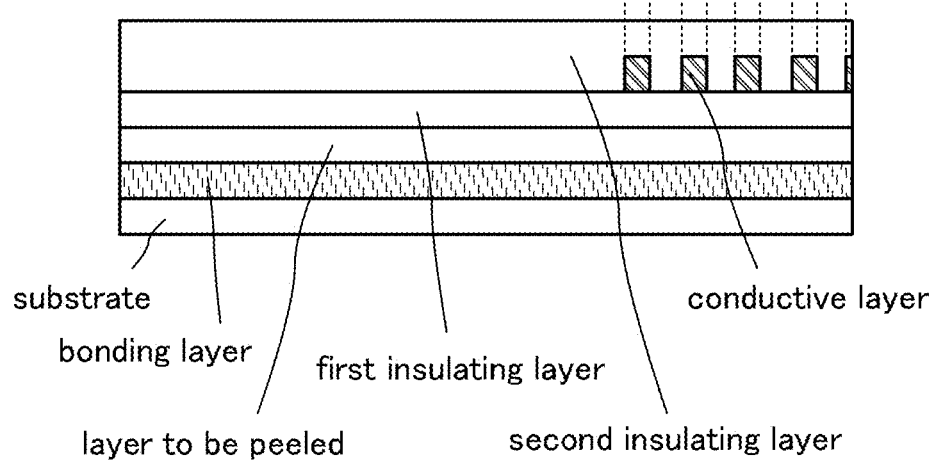

FIG. 12A is an optical micrograph taken after the substrate division. The portion in FIG. 12A is apart from the portions in FIGS. 9A to 11A. A crack occurs in a region where the second insulating layer overlaps with the first insulating layer (the left side in the micrograph). The development of this crack is stopped at an end portion of the conductive layer, and the crack does not develop into an inner side than the end portion.

The above results indicate that development of a crack can be effectively stopped by providing a semiconductor layer, whose end portion is covered with an insulating layer, along the periphery of the substrate. Moreover, the development of a crack can be more effectively stopped by providing a conductive layer on an inner side than the semiconductor layer.

This application is based on Japanese Patent Application serial no. 2013-081897 filed with Japan Patent Office on Apr. 10, 2013, the entire contents of which are hereby incorporated by reference.

What is claimed is:

1. A semiconductor device comprising:
   a semiconductor element over a flexible substrate;
   a semiconductor layer over the flexible substrate and along a periphery of the flexible substrate;
   an insulating layer over the semiconductor element and the semiconductor layer, the insulating layer comprising an opening along the periphery of the flexible substrate; and
   a conductive layer between the semiconductor element and the semiconductor layer,
   wherein a first side surface of the semiconductor layer is covered with the insulating layer,
   wherein a second side surface of the semiconductor layer is exposed,
   wherein a side surface of the flexible substrate and the second side surface of the semiconductor layer overlap each other,
   wherein the conductive layer surrounds the semiconductor element when seen from above,
   wherein the semiconductor layer and the opening surround the conductive layer when seen from above,
   wherein a part of a top surface of the semiconductor layer is exposed in the opening,
   wherein a side surface of the insulating layer is closer to the semiconductor element than the second side surface of the semiconductor layer is, and
   wherein the second side surface of the semiconductor layer is in contact with the part of the top surface of the semiconductor layer.

2. The semiconductor device according to claim 1, wherein each of the semiconductor layer and the opening has a shape of a closed curve when seen from above.

3. The semiconductor device according to claim 1, further comprising a bonding layer and a layer containing an insulating material,
wherein the bonding layer and the layer containing the insulating material are positioned between the flexible substrate and the semiconductor layer.

4. The semiconductor device according to claim 1, wherein the semiconductor element comprises a transistor.

5. The semiconductor device according to claim 4, wherein the semiconductor layer comprises the same material as a semiconductor in a channel of the transistor.

6. The semiconductor device according to claim 4, wherein the conductive layer comprises the same material as a gate electrode, a source electrode, or a drain electrode of the transistor.

7. A semiconductor device comprising:
a semiconductor element over a flexible substrate;
a semiconductor layer over the flexible substrate and along a periphery of the flexible substrate;
an insulating layer over the semiconductor element and the semiconductor layer, the insulating layer comprising an opening along the periphery of the flexible substrate; and
a conductive layer between the semiconductor element and the semiconductor layer,
wherein a first side surface of the semiconductor layer is covered with the insulating layer,
wherein a second side surface of the semiconductor layer is exposed,
wherein a side surface of the flexible substrate and the second side surface of the semiconductor layer overlap each other,
wherein the conductive layer surrounds the semiconductor element when seen from above,
wherein the semiconductor layer and the opening surround the conductive layer when seen from above, and
wherein a part of a top surface of the semiconductor layer is exposed in the opening.

8. The semiconductor device according to claim 7, wherein each of the semiconductor layer and the opening has a shape of a closed curve when seen from above.

9. The semiconductor device according to claim 7, further comprising a bonding layer and a layer containing an insulating material,
wherein the bonding layer and the layer containing the insulating material are positioned between the flexible substrate and the semiconductor layer.

10. The semiconductor device according to claim 7, wherein the semiconductor element comprises a transistor.

11. The semiconductor device according to claim 10, wherein the semiconductor layer comprises the same material as a semiconductor in a channel of the transistor.

12. The semiconductor device according to claim 10, wherein the conductive layer comprises the same material as a gate electrode, a source electrode, or a drain electrode of the transistor.

* * * * *